United States Patent
Bilenko et al.

(10) Patent No.: US 11,804,694 B2
(45) Date of Patent: Oct. 31, 2023

(54) LASER DEVICE AND METHOD OF TRANSFORMING LASER SPECTRUM

(71) Applicants: SAMSUNG ELECTRONICS CO., LTD., Suwon-si (KR); INTERNATIONAL CENTER FOR QUANTUM OPTICS & QUANTUM TECHNOLOGIES LIMITED LIABILITY COMPANY, Moscow (RU)

(72) Inventors: Igor Antonovich Bilenko, Russian Federation (RU); Vitali Valentinovich Vasiliev, Russian Federation (RU); Andrey Sergeevich Voloshin, Russian Federation (RU); Sergey Nikolaevich Koptyaev, Moscow (RU); Grigoriy Vasil'evich Lihachev, Moscow (RU); Valery Evgenievich Lobanov, Russian Federation (RU); Nikolay Genad'evich Pavlov, Russian Federation (RU); Stanislav Vladimirovich Polonsky, Moscow (RU); Maxim Vladimirovich Riabko, Moscow (RU); Alexey Andreevich Shchekin, Moscow (RU)

(73) Assignees: SAMSUNG ELECTRONICS CO., LTD., Suwon-si (KR); INTERNATIONAL CENTER FOR QUANTUM OPTICS & QUANTUM TECHNOLOGIES LIMITED LIABILITY COMPANY, Moscow (RU)

( * ) Notice: Subject to any disclaimer, the term of this patent is extended or adjusted under 35 U.S.C. 154(b) by 268 days.

(21) Appl. No.: 16/827,095

(22) Filed: Mar. 23, 2020

(65) Prior Publication Data

US 2020/0313389 A1 Oct. 1, 2020

(30) Foreign Application Priority Data

Feb. 18, 2020 (KR) ........................ 10-2020-0019998

(51) Int. Cl.
*H01S 5/10* (2021.01)
*H01S 5/068* (2006.01)
(Continued)

(52) U.S. Cl.
CPC ............ *H01S 5/1092* (2013.01); *H01S 5/068* (2013.01); *H01S 5/0656* (2013.01);
(Continued)

(58) Field of Classification Search
CPC .... H01S 5/142; H01S 5/4062; H01S 5/06255; H01S 5/0656; H01S 5/0622;
(Continued)

(56) References Cited

U.S. PATENT DOCUMENTS

| 4,677,630 | A | * | 6/1987 | Fujita | ...................... | H01S 5/026 |
| | | | | | | 372/50.1 |
| 5,231,533 | A | * | 7/1993 | Gonokami | .............. | G02F 1/355 |
| | | | | | | 372/18 |

(Continued)

FOREIGN PATENT DOCUMENTS

| CN | 102377098 A | * | 3/2012 | ........... H01S 5/0656 |
| CN | 104966989 A | * | 10/2015 | ............... H01S 5/06 |

(Continued)

OTHER PUBLICATIONS

Pavlov et al., "Narrow Linewidth Diode Laser Self-Injection Locked to a High-Q Microresonator," Mar. 1, 2018, AIP Conference Proceedings 1936, 020005, 1-4. (Year: 2018).*
(Continued)

*Primary Examiner* — Joshua King
(74) *Attorney, Agent, or Firm* — Sughrue Mion, PLLC

(57) ABSTRACT

Provided are a laser device and a method of transforming laser spectrum, which provide a laser frequency stabilization
(Continued)

and significant narrowing a laser spectrum. A laser device includes at least one multiple longitudinal mode laser (L) for generating a laser light having a spectrum of multiple longitudinal modes; at least one high quality factor (high-Q) microresonator (M) optically feedback coupled to the at least one multiple longitudinal mode laser (L); and a tuner (TU) for tuning the spectrum of multiple longitudinal modes of the laser light. The laser device is configured to output an output laser light having an output spectrum with at least one dominant longitudinal laser mode each at a reduced linewidth of the dominant longitudinal laser mode. The laser device allows increasing an emission power of a narrow linewidth lasing without an additional amplification while keeping a compact size of a device with a limited number of optical elements.

32 Claims, 12 Drawing Sheets

(51) Int. Cl.
 H01S 5/14 (2006.01)
 H01S 5/065 (2006.01)
 H01S 5/40 (2006.01)
 H01S 5/0625 (2006.01)
 H01S 5/12 (2021.01)
 H01S 5/06 (2006.01)
(52) U.S. Cl.
 CPC ........ *H01S 5/0657* (2013.01); *H01S 5/06255* (2013.01); *H01S 5/12* (2013.01); *H01S 5/142* (2013.01); *H01S 5/4062* (2013.01); *H01S 5/4068* (2013.01); *H01S 5/4087* (2013.01); *H01S 5/0612* (2013.01); *H01S 5/0653* (2013.01)
(58) Field of Classification Search
 CPC ....... H01S 5/0653–0655; H01S 5/4006; H01S 5/1021; H01S 5/1092–1096; H01S 5/026–0268
 See application file for complete search history.

(56) References Cited

U.S. PATENT DOCUMENTS

| | | | | |
|---|---|---|---|---|
| 5,555,253 A * | 9/1996 | Dixon | ..................... | H01S 5/141 372/100 |
| 6,567,436 B1 | 5/2003 | Yao et al. | | |
| 6,633,696 B1 | 10/2003 | Vahala et al. | | |
| 6,762,869 B2 | 7/2004 | Maleki et al. | | |
| 6,873,631 B2 | 3/2005 | Yao et al. | | |
| 6,891,865 B1 * | 5/2005 | Ma | ......................... | H01S 5/141 372/20 |
| 7,630,417 B1 * | 12/2009 | Maleki | ..................... | G02F 1/353 385/5 |
| 7,965,745 B2 * | 6/2011 | Maleki | ..................... | H01S 5/065 372/20 |
| 8,102,597 B1 * | 1/2012 | Maleki | ............... | G02B 6/29341 372/92 |
| 8,111,722 B1 * | 2/2012 | Maleki | ..................... | G02F 1/353 372/18 |
| 8,331,008 B1 * | 12/2012 | Matsko | .............. | G02B 6/29341 359/239 |
| 8,331,409 B1 * | 12/2012 | Liang | ..................... | H01S 3/1303 372/29.016 |
| 8,514,400 B2 * | 8/2013 | Mohageg | ............... | G01C 19/72 356/459 |
| 8,565,274 B2 | 10/2013 | Maleki et al. | | |
| 8,681,827 B2 * | 3/2014 | Maleki | ............... | H03B 17/00 372/21 |
| 8,743,372 B2 | 6/2014 | Fourguette et al. | | |
| 8,804,231 B2 * | 8/2014 | Savchenkov | ......... | H01S 3/1304 372/32 |
| 8,831,056 B2 | 9/2014 | Savchenkov et al. | | |
| 9,014,230 B2 | 4/2015 | Liu et al. | | |
| 9,118,165 B1 * | 8/2015 | Norberg | ............. | H01S 3/08027 |
| 9,348,154 B2 * | 5/2016 | Hayakawa | ............... | G02F 1/225 |
| 9,348,194 B2 | 5/2016 | Herr et al. | | |
| 9,391,696 B1 * | 7/2016 | Orcutt | ..................... | H01S 5/141 |
| 9,535,219 B2 | 1/2017 | Goldsmith et al. | | |
| 9,703,045 B2 | 7/2017 | Evans et al. | | |
| 10,038,301 B1 * | 7/2018 | Eggleston | ............. | H01S 5/1092 |
| 2002/0018611 A1 * | 2/2002 | Maleki | ..................... | G02B 6/34 372/92 |
| 2003/0165173 A1 * | 9/2003 | Helbing | .................. | H04J 14/02 372/26 |
| 2004/0184711 A1 * | 9/2004 | Bradley | ............. | G02B 6/12007 385/16 |
| 2004/0228564 A1 * | 11/2004 | Gunn | .................. | G02B 6/12004 385/1 |
| 2005/0025199 A1 * | 2/2005 | Ma | ......................... | H01S 5/141 372/20 |
| 2005/0175358 A1 * | 8/2005 | Ilchenko | ................. | G02F 1/011 398/198 |
| 2005/0286602 A1 * | 12/2005 | Gunn | .................. | G02B 6/12007 372/50.1 |
| 2006/0002432 A1 | 1/2006 | Vahala et al. | | |
| 2006/0245456 A1 | 11/2006 | Lasri et al. | | |
| 2008/0310463 A1 * | 12/2008 | Maleki | .................. | H01S 5/1032 372/20 |
| 2010/0034223 A1 * | 2/2010 | Osinski | ................... | H01S 5/026 977/773 |
| 2010/0118375 A1 * | 5/2010 | Maleki | .................. | G02F 1/0353 372/18 |
| 2010/0135346 A1 * | 6/2010 | Peters | ..................... | H04J 14/02 372/29.011 |
| 2011/0150485 A1 * | 6/2011 | Seidel | ..................... | G02F 2/002 398/115 |
| 2011/0255094 A1 * | 10/2011 | Mohageg | ............... | G01C 19/72 356/461 |
| 2011/0304853 A1 * | 12/2011 | Yamada | ..................... | H01S 5/14 372/20 |
| 2011/0310917 A1 * | 12/2011 | Krishnamoorthy | .. | H04B 10/506 372/23 |
| 2011/0310918 A1 * | 12/2011 | Yoon | ..................... | H01S 5/0265 372/99 |
| 2012/0012739 A1 | 1/2012 | Koch et al. | | |
| 2012/0020616 A1 * | 1/2012 | Babie | ..................... | H04J 14/02 385/27 |
| 2012/0039346 A1 * | 2/2012 | Liang | ..................... | H01S 5/1075 372/20 |
| 2012/0063474 A1 * | 3/2012 | Ayotte | .................. | H01S 5/0078 372/20 |
| 2012/0195332 A1 * | 8/2012 | Yoffe | ..................... | H01S 5/1032 372/98 |
| 2012/0294319 A1 * | 11/2012 | Maleki | ..................... | G02F 1/39 372/18 |
| 2012/0320939 A1 * | 12/2012 | Baets | ..................... | H01S 5/1032 372/45.01 |
| 2013/0003766 A1 * | 1/2013 | Savchenkov | ......... | H01S 5/142 372/32 |
| 2013/0322475 A1 | 12/2013 | LaComb | | |
| 2014/0085633 A1 | 3/2014 | Preston et al. | | |
| 2014/0133511 A1 * | 5/2014 | Tanaka | .................. | H01S 5/0687 372/50.22 |
| 2014/0321848 A1 * | 10/2014 | Sekiguchi | ............ | H04B 10/516 398/38 |
| 2015/0016767 A1 * | 1/2015 | Akiyama | .................. | G02F 1/225 385/3 |
| 2015/0236809 A1 * | 8/2015 | Dong | ..................... | H01S 5/142 398/79 |
| 2015/0285728 A1 * | 10/2015 | Ozdemir | .......... | G01N 15/1434 356/301 |
| 2015/0323743 A1 * | 11/2015 | Nicholson | .......... | G02B 6/29341 385/24 |

(56) References Cited

U.S. PATENT DOCUMENTS

| | | | | |
|---|---|---|---|---|
| 2016/0204576 | A1* | 7/2016 | Chen | H01S 5/142 372/45.01 |
| 2016/0218481 | A1* | 7/2016 | Akiyama | G02F 1/225 |
| 2016/0261091 | A1* | 9/2016 | Santis | H01S 5/1032 |
| 2016/0266110 | A1 | 9/2016 | Ozdemir et al. | |
| 2016/0301477 | A1* | 10/2016 | Orcutt | H04B 10/516 |
| 2016/0336718 | A1* | 11/2016 | Takabayashi | H01S 5/0078 |
| 2017/0207600 | A1* | 7/2017 | Klamkin | H01S 5/1032 |
| 2018/0083599 | A1* | 3/2018 | Kippenberg | H04J 14/06 |
| 2019/0097383 | A1* | 3/2019 | Akiyama | G02B 27/0977 |
| 2019/0140415 | A1* | 5/2019 | Sun | H01S 5/1246 |
| 2019/0372193 | A1* | 12/2019 | Maleki | H01S 3/0085 |

FOREIGN PATENT DOCUMENTS

| | | | | |
|---|---|---|---|---|
| EP | 1 988 425 | B1 | 7/2014 | |
| EP | 3190672 | A1 * | 7/2017 | H01S 5/021 |
| EP | 3657243 | A1 * | 5/2020 | |
| WO | WO-2015001421 | A2 * | 1/2015 | H01S 5/1032 |
| WO | WO-2017131898 | A1 * | 8/2017 | G02B 6/12004 |
| WO | WO-2018235317 | A1 * | 12/2018 | G02B 6/26 |
| WO | WO-2019002763 | A1 * | 1/2019 | H01S 5/1032 |
| WO | WO-2020057716 | A1 * | 3/2020 | G02F 1/3513 |

OTHER PUBLICATIONS

Kondratiev et al., "Self-Injection Locking of a Laser Diode to a High-Q WGM Microresonator," Oct. 30, 2017, Optics Express, vol. 25, No. 23, 28167-28178. (Year: 2017).*

Spencer et al., "An Optical-Frequency Synthesizer Using Integrated Photonics," May 3, 2018, Nature, vol. 557, 81-87 (Year: 2018).*

L. Ricci et al., "A Compact grating-stabilized diode laser system for atomic physics", Optics Communications, 1995, vol. 117, pp. 541-549 (9 pages total).

Gregory J. Steckman et al., "Volume Holographic Grating Wavelength Stabilized Laser Diodes" IEEE Journal of Selected Topics in Quantum Electronics, May/Jun. 2007, vol. 13, No. 3, pp. 672-678 (7 pages total).

B. Dahmani et al., "Frequency stabilization of semiconductor lasers by resonant optical feedback", Optics Letters, Nov. 1987, vol. 12, No. 11, pp. 876-878 (3 pages total).

L. Hollberg et al., "Modulatable narrow-linewidth semiconductor lasers", American Institute of Physics, Sep. 12, 1988, pp. 944-946 (3 pages total).

Yang Zhao et al., "High-finesse cavity external optical feedback DFB laser with hertz relative linewidth", Optics Letters, Nov. 15, 2012, vol. 37, No. 22, pp. 4729-4731 (4 pages total).

Dmitry V Strekalov et al., "Nonlinear and quantum optics with whispering gallery resonators", Journal of Optics, Nov. 16, 2016, pp. 1-43 (44 pages total).

Guoping Lin et al., "High-Q UV whispering gallery mode resonators made of angle-cut BBO crystals", Optics Express, Sep. 10, 2012, vol. 20, No. 19, pp. 21372-21378 (7 pages total).

Ivan S. Grudinin et al., "Ultra high Q crystalline microcavities", Optics Communications, Mar. 2, 2006, vol. 265, pp. 33-38 (6 pages total).

Simone Borri et al., "Whispering gallery mode Stabilization of Quantum Cascade Lasers for Infrared Sensing and Spectroscopy", Proceedings of SPIE, 2017, vol. 10090, pp. 1009008-1-1009008-8 (9 pages total).

W. Liang et al., "Whispering-gallery-mode-resonator-based ultranarrow linewidth external-cavity semiconductor laser", Optics Letters, Aug. 15, 2010, vol. 35, No. 16, pp. 2822-2824 (3 pages total).

W. Liang et al., "Ultralow noise miniature external cavity semiconductor laser", Nature Communications, Jun. 24, 2015, pp. 1-6 (6 pages total).

Zhenda Xie et al., "Extended ultrahigh-Q-cavity diode laser", Optics Letters, Jun. 1, 2015, vol. 40, No. 11, pp. 2596-2599 (4 pages total).

Bernd Sumpf et al., "Dual-wavelength diode laser with electrically adjustable wavelength distance at 785 nm", Optics Letters, Aug. 15, 2016, vol. 41, No. 16, pp. 3694-3697 (4 pages total).

Rosemary Diaz et al., "Lidar detection using a dual-frequency source", Optics Letters, Dec. 15, 2006, vol. 31, No. 24, pp. 3600-3602 (3 pages total).

N. Ninane et al., "Holographic interferometry using two-wavelength holography for the measurement of large deformations", Applied Optics, Apr. 10, 1995, vol. 34, No. 11, pp. 1923-1928 (6 pages total).

Claus-Stefan Friedrich et al., "New Two-Color Laser Concepts for THz Generation", IEEE Journal of Selected Topics in Quantum Electronics, Mar./Apr. 2008, vol. 14, No. 2, pp. 270-276 (7 pages total).

B.M. Walsh, "Dual Wavelength Lasers", Physics of Lasers, Apr. 2010, vol. 20, No. 3, pp. 622-634 (14 pages total).

Der-Chin Su et al., "Simple two-frequency laser", Elsevier Science Inc., Apr./May 1996, vol. 18, No. 2/3, pp. 161-163 (3 pages total).

P. Dirksen et al., "Novel two-frequency laser", Elsevier Science Inc., 1995, vol. 17, pp. 114-116 (3 pages total).

Mohammed Al-Mumin et al., "Injection locked multi-section gain-coupled dual mode DFB laser for terahertz generation", Optics Communication, Mar. 5, 2007, vol. 275, pp. 186-189 (4 pages total).

Namje Kim et al., "Monolithic dual-mode distributed feedback semiconductor laser for tunable continuous-wave terahertz generation", Optics Express, Aug. 3, 2009, vol. 17, No. 16, pp. 13851-13859 (9 pages total).

S. Hoffmann et al., "Four-wave mixing and direct terahertz emission with two-color semiconductor lasers", Applied Physics Letters, Apr. 23, 2004, vol. 84, No. 18, pp. 3585-3587 (4 pages total).

Wei Wang et al., "A Beat-Frequency Tunable Dual-Mode Fiber-Bragg-Grating External-Cavity Laser", IEEE Photonics Technology Letters, Nov. 2005, vol. 17, No. 11, pp. 2436-2438 (3 pages total).

Veronique Zambon et al., "Tunable dual-wavelength operation of an external cavity semiconductor laser", Optics Communications, Feb. 9, 2006, vol. 264, pp. 180-186 (7 pages total).

S.A. Zolotovskaya et al., "Stable dual-wavelength operation of InGaAs diode laser with volume Bragg gratings", IEEE, downloaded date Aug. 26, 2020, p. 1 (1 page total).

S.A. Zolotovskaya et al., "Two-Color Output From InGaAs Laser With Multiplexed Reflective Bragg Mirror", IEEE Photonics Technology Letters, Aug. 1, 2009, vol. 21, No. 15, pp. 1093-1095 (3 pages total).

* cited by examiner

LASER DEVICE AND METHOD OF TRANSFORMING LASER SPECTRUM

CROSS-REFERENCE TO RELATED APPLICATIONS

This application is based on and claims priority from Russian Patent Application No. 2019108976, filed on Mar. 27, 2019, in the Russian Patent Office and Korean Patent Application No. 10-2020-0019998, filed on Feb. 18, 2020, in the Korean Intellectual Property Office, the disclosures of which are incorporated herein in their entirety by reference.

BACKGROUND

1. Field

The disclosure relates to laser devices and methods of transforming a laser spectrum.

2. Description of the Related Art

There are various approaches for the laser frequency stabilization and laser spectrum narrowing. Certain information presented below may aid in understanding the physical principles and/or specific material and technical means underlying the disclosure.

A common approach for passive laser frequency stabilization and laser spectrum narrowing includes using a resonant optical feedback from an external optical element. Various perturbations such as a temperature variation and a vibration may cause a laser to fluctuate in a wavelength, a power level and an optical phase. A more stable external optical element providing spectrally selective optical feedback such as a diffraction grating, a high finesse (high-Q) Fabry-Perot (FP) cavity or their combination enables laser spectrum narrowing and stable frequency of laser generation. When a high-Q (high quality factor) cavity is used, a stabilized laser is well above threshold and optimal frequency stabilization is achieved with a weak optical feedback ($<10^{-4}$). External high-Q cavity optical feedback technique provides a higher output power and a better short-term stability than stabilization using a diffraction grating. However, high-finesse FP cavities successfully used for many laser stabilization applications are comparatively large and used only in laboratories. Besides, high-finesse mirror coatings are very specific to one narrow range of wavelength.

Other important prototypes are dual-wavelength lasers required for spectroscopy, LIDAR applications, holographic interferometry, optical terahertz sources and other applications. First of all, a widely separated (hundreds of nm) dual wavelength device may be realized using, for example, dual wavelength lasing on two different ions in a single solid-state laser material or simultaneous lasing on two wavelengths in a single ion. Generally, a two-frequency generation with a small wavelength difference (up to tens of nm) was realized using an electro-optical or acousto-optical modulation of a single-frequency laser radiation. However, such devices are not very compact. To date different techniques have been developed to achieve dual-wavelength operation from a compact diode laser system, and they mainly may be classified into two categories: (1) monolithic dual-wavelength diode lasers and (2) diode laser systems based on different external-cavity feedback techniques. The monolithic dual-wavelength diode lasers show stable dual-wavelength operation, but a tuning range of a frequency difference of two wavelengths is limited, and an output power is usually less than 500 mW. Different frequency-selective elements have been used in external-cavity feedback techniques, such as bulk diffractive gratings for the double-Littman and double-Littrow external-cavity techniques, a dual-fiber Bragg grating, a dual-period holographic element, and single-wavelength volume Bragg gratings or a monolithic multiplexed Bragg grating. A gain medium in an external-cavity dual-wavelength diode laser system is usually a single-mode ridge-waveguide diode laser, so an output power from these laser systems is usually a few hundred milliwatts.

SUMMARY

Provided are laser devices and methods of transforming a laser spectrum, which provide a laser frequency stabilization and significant narrowing a laser spectrum due to its power-efficient transformation from a spectrum containing a plurality of relatively broad longitudinal modes into a narrow single-mode one or into a spectrum with several narrow spectral modes.

The disclosure will now be described by way of example and not limitation with reference to the description and figures provided below.

This summary of the disclosure precedes the detailed description of specific exemplary embodiments to provide an overview of the aspects of the disclosure, which will be further explained below, and is not intended to define or limit the scope of the disclosure in any way.

The disclosure includes providing a compact device based on a multiple longitudinal mode laser locked to high-Q microresonator for delivering one or several powerful narrow laser lines having typically about 1 kHz linewidths or less and in some cases one or several parametrically generated optical frequency combs.

The technical result of the disclosure includes increasing an emission power of a narrow linewidth lasing without an additional amplification while keeping a compact size of a device with a limited number of optical elements. An increased emission power is a result of use of broad-spectrum multiple longitudinal mode lasers that are much more powerful than traditionally used DFB lasers locked to a WGMs microresonator for spectrum narrowing and optical frequency comb generation. In this case, longitudinal modes competition under the condition of the resonant optical feedback leads to effective laser power redistribution in favor of one or several narrow laser lines at resonance frequencies of the high-Q microresonator. Furthermore, the disclosure provides a more compact and powerful dual-wavelength or even multi-wavelength laser device generating narrow linewidths and having at least one high-Q external cavity. Also, the disclosure provides a compact powerful source of one or several parametrically generated optical frequency combs by using the at least one high-Q microresonator.

Additional aspects will be set forth in part in the description which follows and, in part, will be apparent from the description, or may be learned by practice of the exemplary embodiments.

According to an aspect of an embodiment, a laser device includes at least one multiple longitudinal mode laser for generating a laser light having a spectrum of multiple longitudinal modes; at least one high quality factor (high-Q) microresonator optically feedback coupled to the at least one multiple longitudinal mode laser; a tuner for tuning the spectrum of multiple longitudinal modes of the laser light to match each of at least one frequency of an individual longitudinal mode of the at least one multiple longitudinal mode laser with a respective resonance frequency of the at least one high-Q microresonator so as to obtain at least one matched frequency, wherein the laser device is configured to output an output laser light having an output spectrum with at least one dominant longitudinal laser mode and at a reduced linewidth of the dominant longitudinal laser mode, and wherein each of the at least one dominant longitudinal laser mode corresponds to one of the at least one matched frequency.

The at least one high-Q microresonator may be made of a material having an intensity-dependent refraction index, wherein the laser device may be further configured to produce at least one optical frequency comb, wherein each of the at least one optical frequency comb may be parametrically generated by one of the at least one dominant longitudinal laser mode, based on the at least one dominant longitudinal laser mode having a power above a pump threshold of an optical frequency comb generation.

The tuner may be further configured to both change a spacing of the longitudinal modes at a frequency domain and change a frequency of each of the individual longitudinal modes of the at least one multiple longitudinal mode laser.

The at least one high-Q microresonator may be configured to provide an optical feedback to the at least one multiple longitudinal mode laser by generating at least one counter-propagating mode each at one of the at least one matched frequency.

The at least one multiple longitudinal mode laser may be an electrically powered semiconductor laser diode.

The at least one multiple longitudinal mode laser and the at least one high-Q microresonator may be made on a same chip using microlithography.

The tuner may be further configured to control an injection current of the at least one multiple longitudinal mode laser and/or a temperature of a laser active medium of each of the at least one multiple longitudinal mode laser, for example, each of the at least one multiple longitudinal mode laser individually.

The at least one multiple longitudinal mode laser may be optically feedback coupled to the at least one high-Q microresonator by coupling out a light scattered in the at least one high-Q microresonator back to the at least one multiple longitudinal mode laser.

One or several of the at least one multiple longitudinal mode laser may be optically feedback coupled to one or several of the at least one high-Q microresonator through a coupling element.

The coupling element may include at least one of a total internal reflection prism, a tapered optical fiber, and a waveguide.

One or several of the at least one high-Q microresonator may be provided with an additional coupling element.

The additional coupling element may be configured to output one or several of the dominant longitudinal laser modes generated in the one or several of the at least one high-Q microresonator or the one or several of the dominant longitudinal laser modes and one or several optical frequency combs generated in the one or several of the at least one high-Q microresonator to filter out a non-resonant part of the output spectrum.

The at least one optical frequency comb may be a dissipative Kerr soliton optical comb.

The tuner may be further configured to tune resonance frequencies of the high-Q modes of the at least one high-Q microresonator by both changing a spacing of the high-Q modes at a frequency domain and changing a resonance frequency of each of the high-Q modes.

The tuner may be further configured to control a temperature of the at least one high-Q microresonator or/and an external pressure applied to the at least one high-Q microresonator, for example, each of the at least one high-Q microresonator individually.

The at least one high-Q microresonator may be made of an electro-optical material changing its refractive index in response to an electromagnetic field applied the at least one high-Q microresonator, and wherein the tuner may be further configured to control the electromagnetic field applied to the at least one high-Q microresonator, for example, each of the at least one high-Q microresonator individually.

The at least one high-Q microresonator may be a whispering-gallery modes (WGMs) microresonator.

According to an aspect of another embodiment, a method of transforming a laser spectrum includes generating, by at least one multiple longitudinal mode laser, a laser light having a spectrum of multiple longitudinal modes; tuning the spectrum of multiple longitudinal modes of the laser light to match each of at least one frequency of an individual longitudinal mode of the at least one multiple longitudinal mode laser with a respective resonance frequency of at least one high-Q microresonator optically feedback coupled to the at least one multiple longitudinal mode laser so as to obtain at least one matched frequency; and outputting an output laser light having an output spectrum with at least one dominant longitudinal laser mode and at a reduced linewidth of the dominant longitudinal laser mode, wherein each of the at least one dominant longitudinal laser mode corresponds to one of the at least one matched frequency.

The at least one high-Q microresonator may be made of a material having an intensity-dependent refraction index, and wherein the method may further include parametrically generating at least one optical frequency comb by each of the at least one dominant longitudinal laser mode, based on the at least one dominant longitudinal laser mode having a power above a pump threshold of an optical frequency comb generation.

The spectrum of multiple longitudinal modes may be tuned by both changing a spacing of longitudinal modes at a frequency domain and changing a frequency of each of individual longitudinal modes of the at least one multiple longitudinal mode laser.

The at least one high-Q microresonator may be configured to provide an optical feedback to the at least one multiple longitudinal mode laser by generating at least one counter-propagating mode each at one of the at least one matched frequency.

The spectrum of the longitudinal modes may be tuned by controlling an injection current of the at least one multiple longitudinal mode laser and/or a temperature of a laser active medium of the at least one multiple longitudinal mode laser, for example, each of the at least one multiple longitudinal mode laser individually.

The at least one counter-propagating mode coupled back to the at least one multiple longitudinal mode laser may be generated due to a resonant Rayleigh scattering in the at least one high-Q microresonator.

One or several of the at least one multiple longitudinal mode laser may be optically feedback coupled to one or several of the at least one high-Q microresonator through a coupling element.

The coupling element may include at least one of a total internal reflection prism, a tapered optical fiber, and a waveguide.

One or several of the at least one high-Q microresonator may be provided with an additional coupling element.

One or several dominant longitudinal laser modes or the one or several dominant longitudinal laser modes and one or several optical frequency combs may be output from one or several of the at least one high-Q microresonator through the additional coupling element to filter out a non-resonant part of the output spectrum.

Resonance frequencies of high-Q modes of the at least one high-Q microresonator may be tuned by both changing a spacing of the high-Q modes at the frequency domain and changing a resonance frequency of each of the high-Q modes.

The method may further include controlling a temperature of the at least one high-Q microresonator or/and an external pressure applied to the at least one high-Q microresonator, for example, each of the at least one high-Q microresonator individually.

The at least one high-Q microresonator may be made of an electro-optical material changing its refractive index in response to an electromagnetic field applied the at least one high-Q microresonator, and wherein the method may further include controlling the electromagnetic field applied to the at least one high-Q microresonator, for example, each of the at least one high-Q microresonator individually.

The at least one high-Q microresonator may be a WGMs microresonator.

According to an aspect of another embodiment, a method of operating a laser device that includes at least one multiple longitudinal mode laser for generating a laser light having a spectrum of multiple longitudinal modes and at least one high quality factor (high-Q) microresonator optically feedback coupled to the at least one multiple longitudinal mode laser is provided. The method includes tuning the spectrum of multiple longitudinal modes of the laser light to match each of at least one frequency of an individual longitudinal mode of the at least one multiple longitudinal mode laser with a respective resonance frequency of the at least one high-Q microresonator so as to obtain at least one matched frequency; and outputting an output laser light having a output spectrum with at least one dominant longitudinal laser mode each at one of the at least one matched frequency and at a reduced linewidth of the dominant longitudinal laser mode.

BRIEF DESCRIPTION OF THE DRAWINGS

Reference will now be made to exemplary embodiments, which are presented in a detailed description below, the exemplary embodiments being intended to be read in conjunction with the accompanying drawings and not intended to define or limit the scope of the disclosure in any way, but rather providing specific examples of its implementation. It will be understood by persons skilled in the art that other embodiments, modifications or equivalent substitutions may be apparent basing on the teachings of this description, and all such embodiments, modifications and equivalent substitutions are deemed encompassed by the disclosure.

The figures are provided solely for the purpose of illustration as aid in reading and understanding the description, and should not in any way be regarded as defining or limiting the scope of the disclosure.

DETAILED DESCRIPTION

Figure 1A:
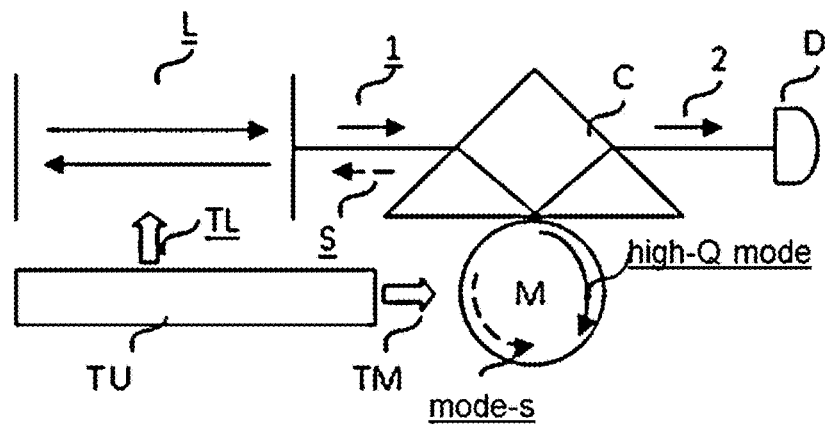
FIG. 1A shows one multiple longitudinal mode laser L coupled to one crystalline optical high-Q microresonator M enabling propagation of high-Q modes using a coupling element as a total internal reflection prism C.

Hereinafter, embodiments of the disclosure will be described in detail with reference to the accompanying drawings. In the following drawings, like reference numerals refer to like elements, and the size of each element in the drawings may be exaggerated for clarity and convenience of explanation. The embodiments described below are merely illustrative, and various other modifications can be made from these embodiments.

An approach to laser frequency stabilization and spectrum narrowing is implementation of compact high-Q crystalline WGMs microresonators. The compact ring resonators have a characteristic dimension about 0.1 mm to about 10 mm and may possess ultrahigh quality-factor from the ultra-violet (UV) region to that of the mid-infrared (MIR). An optical feedback from the high-Q crystalline WGMs microresonator is based on resonant Rayleigh scattering because of resonator's surface inhomogeneities: some amount of light reflects back into a laser when a laser light frequency matches to a frequency of a resonator mode. In other words, the spectrally selected portion of a laser light self-injected back to the laser locks its generation frequency. This process named as "self-injection locking" provides a fast optical feedback and results in a significant laser spectrum narrowing. Nowadays, linewidth narrowing and frequency stabilization of various types of lasers, including quantum cascade lasers and distributed feedback (DFB) lasers, due to self-injection locking to a WGMs microresonator have been reported, and actually, linewidth reduction down to ~Hz level is demonstrated.

The self-injection locking using WGMs microresonators is mostly applied for frequency stabilization and narrowing a spectrum of single-mode laser diodes preliminary stabilized by a grating placed in a laser active medium like in DFB lasers or by implementing any types of Bragg's reflectors. The main reason for this is that there is better laser frequency stability when only one microresonator's mode is within a laser gain bandwidth since unwanted multimode lasing and mode competition may occur, if several modes produce an equal optical feedback. Usually ultrahigh-Q WGMs microresonators have large spectral density of resonance modes and the above mentioned lasers with preliminary stabilization have relatively narrow linewidth ~1-10 MHz and limited emission power about tens of milliwatts. A crystalline $MgF_2$ optical microresonator pumped with a compact distributed feedback (DFB) laser, which is self-injection locked to an optical resonator, is known to provide a compact optical frequency comb source. When a DFB laser is coupled to an optical microresonator using a total internal reflection prism, a portion of the light is backscattered to the DFB laser due to resonant Rayleigh scattering, inducing self-injection locking the laser frequency to the frequency of a selected optical microresonator mode. This self-injection locking effect results in a 3-4-order narrowing a laser linewidth, if compared with a linewidth of a free running DFB laser, which is necessary to efficiently couple a light from the laser to the optical microresonator and generate an optical frequency comb. However, more powerful narrow linewidth lasers necessary for many applications including coherent LIDARs and spectroscopy require subsequent amplification leading to loss of compactness. Besides DFB lasers are unavailable at all desirable wavelengths corresponding to particular atomic optical transitions. Semiconductor optical amplifiers (SOA) available in much broader wavelength range are used for stabilization in microresonators with preliminary generation spectrum narrowing using diffraction grating cavity. Two cavity configurations usually lead to complex devices that cannot be compact.

A laser device according to embodiments may provide a laser frequency stabilization and significant narrowing a laser spectrum due to its power-efficient transformation from a spectrum containing a plurality of relatively broad longitudinal modes into a spectrum with a narrow single-mode or into a spectrum with several narrow spectral modes, and thus, it is possible to implement a compact laser device that does not require subsequent amplification or two cavity configurations.

In particular, the embodiments provide for a laser device including at least one multiple longitudinal mode laser for generating a laser light having a spectrum of multiple longitudinal modes, at least one optical high-Q microresonator enabling propagation of high-Q modes and optically feedback coupled to the at least one multiple longitudinal mode laser, and a tuner for tuning the spectrum of multiple longitudinal modes of the laser light to match each of at least one frequency of an individual mode of the at least one multiple longitudinal mode laser with a respective resonance frequency of the at least one high-Q microresonator so as to obtain at least one matched frequency. The laser device is configured to produce an output laser light having a transformed spectrum with at least one dominant longitudinal laser mode each at one of the at least one matched frequency and at a reduced linewidth of the dominant longitudinal mode. Besides, the embodiments provide a method of operating the laser device.

It will be understood by persons skilled in the art that various exemplary embodiments should in no case be construed as defining or limiting the scope of the disclosure, and that other material and technical means, equivalent or apparently similar to ones listed below, may be envisaged by persons skilled in the art to perform the various operations, functions, method steps/operations etc. as described herein below. The term "high-Q microresonator" used herein means a traveling wave microcavity for confining light and having characteristic dimension of about 0.01-10 mm, frequently about micrometer-scale size of light field localization in one of the directions. Light is reflected internally at the edges of the high-Q microresonator in a loop-like fashion that creates a series of standing-wave optical high-Q modes or high-Q resonances, similar to those that may exist on a vibrating guitar string. In the high-Q microresonator, the quality-factor Q of the high-Q modes exceeds $10^5$ and may be about $10^6$-$10^9$, for example, $10^8$-$10^9$ and higher. For example, the high-Q microresonators may be spherical, toroidal, disk or any other form of high-Q whispering-gallery modes (WGMs) microresonators with closed path of light in the resonator's cavity that enable propagation of the whispering-gallery modes which are a type of light waves that may travel around a concave surface. Originally discovered for sound waves in the whispering gallery of St. Paul's Cathedral in London, they may exist for light and other waves. In another particular case, the high-Q microresonator may be an integrated resonator of different configurations with closed path of light along the waveguide that enables propagation of high-Q specific waveguide modes. Alternatively, the high-Q microresonators may be a linear Fabry-Perot-like resonator with a closed light path length equal to the doubled longitudinal resonator lengths times refractive index of resonator materials. In this description, the terms "high quality factor microresonator", "high-Q microresonator" are given in the same meaning and may be used interchangeably depending on the context. The terms "high quality factor mode", "high-Q mode" are given in the same meaning for a high-Q mode which propagates in the high-Q microresonator and may be also used interchangeably depending on the context.

In an embodiment, an emission power of a narrow linewidth lasing may be increased without additional amplification that provides a compact size of a device with a limited number of optical elements. An increased power may be a result of use of semiconductor broad-spectrum multiple longitudinal mode lasers that are much more powerful than generally used semiconductor distributed feedback (DFB) lasers locked to a WGMs microresonator. A single mode DFB laser having character spectral width 1-10 MHz coupled to a magnesium fluoride WGMs microresonator is known to provide narrow (<1 kHz) linewidth laser generation due to resonance optical feedback provided by Rayleigh scattering in a microresonator coupled back to a DFB laser. Also a compact optical frequency comb source is well known when a crystalline $MgF_2$ optical WGMs microresonator pumped with a compact distributed feedback (DFB) laser, which is self-injection locked to an optical resonator. When a DFB laser is coupled to an optical WGMs microresonator using a total internal reflection prism, a portion of the light may be backscattered to the DFB laser due to resonant Rayleigh scattering, inducing self-injection locking the laser frequency to the frequency of a selected optical WGMs microresonator mode. This self-injection locking effect may result in a 3-4-order narrowing a laser linewidth as compared with a linewidth of a free running DFB laser (1-10 MHz), which is necessary to efficiently couple light from the laser to the optical WGMs microresonator and generate an optical frequency comb.

Available DFB lasers are limited in emission power by about 50 mW and have a limited working spectral range. In some embodiments, a more powerful multiple longitudinal mode laser, also known as Fabry-Perot laser, coupled to a high-Q microresonator similarly may provide a narrow linewidth generation but with an increased power. The high power narrow linewidth generation may provide a parametrically generated high power optical frequency comb. The multiple longitudinal mode laser may include optical Fabry-Perot resonator usually having two plane-parallel mirrors or two concave mirrors and active medium enclosed inside the resonator. An output spectrum of the laser has a width defined by a gain band of a laser active medium filled with spectral lines spaced by a fixed frequency inversely proportional to the length of the Fabry-Perot resonator. A linewidth of the spectral lines depends on a reflectivity of the mirrors of the Fabry-Perot resonator. In this description, the terms "multiple longitudinal modes" or "laser spectral lines" are given in the same meaning and may be used interchangeably depending on the context. In the context of the disclosure the term "laser spectral line" may be a line of lasing an individual longitudinal mode.

Initial mode pre-selection and pre-stabilization in laser diodes are not required to obtain stable narrow-linewidth, single-frequency lasing, and the high-Q microresonator may handle all of these applications efficiently as well. Consequently, simpler and cheaper Fabry-Pérot (FP) laser diodes with higher power may be used. For example, spectrum of a general near-infrared semiconductor edge-emitting laser has spectral lines of about 20-40 MHz width spaced by about 15-40 GHz frequency in the spectral range of 10-20 nm wide. In one aspect of embodiments, if such laser is coupled to the high-Q microresonator and a frequency of one of individual longitudinal modes of the laser matches with one of the resonance frequencies of the high-Q microresonator, a resonant optical feedback from the high-Q microresonator is occurred at the matched frequency. Next, longitudinal modes competition under the condition of the resonant optical feedback leads to effective laser power redistribution in favor of one dominant longitudinal laser mode at the matched frequency and to reducing its linewidth down to the microresonator's resonance mode linewidth. The terms "dominant longitudinal laser modes" and "spectrally narrow laser lines" used herein are given in the same meaning and may be used interchangeably depending on the context. In the context of the disclosure, the term "spectrally narrow laser line" is a line of lasing a dominant longitudinal laser mode whose linewidth may be reduced down to the microresonator's resonance mode linewidth by the interaction with the high-Q microresonator.

In the context of the disclosure, the terms "matching", "matched frequency" may mean the following. Usually, an individual longitudinal mode linewidth (about 20-40 MHz) is much wider than a microresonator's resonance mode linewidth (about 100 kHz-1 MHz). In view of that, when tuning a laser spectrum, it is necessary to obtain a region of overlapping a spectral curve of an individual longitudinal mode with a spectral curve of a microresonator's resonance mode in the frequency domain. Meanwhile, a part of a laser power of the individual longitudinal mode corresponding to the region of overlapping will be sufficient to provide an optical feedback from the microresonator. In this case, said matched frequency corresponds to a microresonator's resonance frequency, and the center of the spectral curve of the individual longitudinal mode and the center of the spectral curve of the microresonator's resonance mode may not coincide in the frequency domain and may be just close to each other. Usually, "matching" may be achieved when the microresonator's resonance frequency is on a slope of the spectral curve of the individual longitudinal mode. Obviously, there may be other relative positions of spectral curves of the individual longitudinal modes and the spectral curve of microresonator's resonance modes corresponding to their matching and providing different powers of optical feedback from the microresonator. Feedback power levels of several simultaneously locked individual longitudinal modes may significantly affect their competition and redistribution of the laser power in favor of one or several dominant longitudinal laser modes. The dominant longitudinal laser modes may correspond to the longitudinal laser modes at the matched frequencies, wherein their power amplitudes may exceed the amplitudes of the nearest neighboring modes or side modes several times as result of mode competition. Moreover, the side modes may be suppressed as a result of redistribution of the laser power in favor of the dominant longitudinal modes. The side mode suppression ratio (SMSR) parameter which is the ratio of dominant mode's amplitude to the amplitudes of nearest side modes usually characterizes the amount of mode's dominance. Typically, for locked modes according to the disclosure, the SMSR may be in the range of about 30-60 dB, for example, in the range of about 40-60 dB. For example, about 40 dB may often provide a sufficient amount of mode dominance for the purposes of this application.

In an embodiment, since ordinary multiple longitudinal mode lasers are much more powerful (up to 500 mW in continuous wave) than DFB lasers, the resulting power of narrow linewidth generation may be increased and the power of potentially generated optical frequency comb is also increased. As semiconductor Fabry-Perot lasers cover a wider spectral range than DFB lasers, a narrow linewidth generation using coupling with a high-Q microresonator may be achieved at any optical frequency required for specific application.

In an embodiment, when a multiple longitudinal mode laser is locked to a high-Q microresonator, provided may be option of delivering simultaneously several dominant longitudinal laser modes when simultaneously several frequencies of several longitudinal modes of the multiple longitudinal mode laser match to several resonance frequencies of the high-Q microresonator. That provides a compact size of the device with only one multiple longitudinal mode laser and one high-Q microresonator acting as an external cavity, particularly enabling a most compact and powerful dual-wavelength or even multi-wavelength laser device with stabilized frequencies and a reduced linewidths.

In an embodiment shown in FIG. 1A, a multiple longitudinal mode laser L is optically feedback coupled to a high-Q crystalline optical microresonator M through a coupling element C such as a total internal reflection coupling prism. The high-Q microresonator M enables propagation of circulating high-Q modes. In a particular case, the high-Q microresonator M may be a high-Q WGMs microresonator enabling propagating of circulating whispering gallery modes (WGMs). The laser generates a laser light 1 having the spectrum of multiple longitudinal modes. The laser device has a tuner TU for turning a spectrum of multiple longitudinal modes of the laser light 1 generated by the multiple longitudinal mode laser L. The tuner TU may be configured to both change a spacing of the longitudinal modes at a frequency domain and change a frequency of each of the individual longitudinal modes of the laser L to match each of at least one frequency of an individual longitudinal mode of the longitudinal mode laser L with a respective (in the frequency domain) resonance frequency of the high-Q microresonator M so as to obtain at least one matched frequency. For example, if "at least one" used in the phrase "each of at least one frequency of an individual longitudinal mode" equals to one, it means that each of one frequency of one individual longitudinal mode of the multiple longitudinal mode laser L is matched to one respective resonance frequency of the high-Q microresonator. In this case, one matched frequency may be obtained for one frequency pair. If "at least one" used in the phrase "each of at least one frequency of an individual longitudinal mode" equals to three, it means that each of three frequencies of three individual longitudinal modes of the multiple longitudinal mode laser L is matched to a respective resonance frequency of the high-Q microresonator. In this case, three matched frequencies may be obtained for three frequency pairs, where a first frequency of a first individual longitudinal mode may be matched to a first resonance frequency, a second frequency of a second individual longitudinal mode may be matched to a second resonance frequency, a third frequency of a third individual longitudinal mode may be matched to a third resonance frequency. If "at least one" used in the phrase "each of at least one frequency of an individual longitudinal mode" equals to N, it means that N frequencies of N individual longitudinal modes of the multiple longitudinal mode laser L is matched to N respective resonance frequencies of the high-Q microresonator, where N is a number equal to or greater than 1. In this case, N matched frequencies may be obtained for N frequency pairs, where a $1^{st}$ frequency of a $1^{st}$ individual longitudinal mode may be matched to a $1^{st}$ resonance frequency, a $2^{nd}$ frequency of a $2^{nd}$ individual longitudinal mode may be matched to a $2^{nd}$ resonance frequency, . . . , $N^{th}$ frequency of $N^{th}$ individual longitudinal mode may be matched to $N^{th}$ resonance frequency.

The high-Q microresonator M may provide an optical feedback to the at least one multiple longitudinal mode laser L by generating at least one counter-propagating mode (see "mode-s" in FIG. 1A) each at one of the at least one matched frequency. In some embodiments, when the high-Q microresonator M is the high-Q WGMs microresonator, the high-Q microresonator M may provide an optical feedback to the at least one multiple longitudinal mode laser L by generating at least one counter-propagating mode whispering gallery modes (WGMs) each at one of the at least one matched frequency. The at least one counter-propagating mode (mode-s) may be coupled back to the multiple longitudinal mode laser L. Laser light 2 coming to a photodetector D combines the light coupled out from the high-Q microresonator M through the total internal reflection coupling prism C and the laser light 1 not coupled to the high-Q microresonator M. The at least one counter-propagating mode (mode-s) coupled back to the multiple longitudinal mode laser L in the form of light wave(s) S is provided due to a resonant Rayleigh scattering in the high-Q microresonator M. Under the condition of the resonant optical feedback, a power of the multiple longitudinal mode laser L may be effectively redistributed due to longitudinal mode competition in favor of at least one dominant longitudinal laser mode each at one of the at least one matched frequency. The laser device may be configured to produce an output laser light having an output spectrum with the at least one dominant longitudinal laser mode at a reduced linewidth of the at least one dominant longitudinal mode (as compared with respective individual longitudinal mode of the laser). For example, if five matched frequencies were obtained, five dominant longitudinal laser modes will present in the output spectrum. In general, another type of coupling element C such as a tapered optical fiber or a waveguide may be used instead of total internal reflection prism as schematically shown in the FIG. 1A. The variant of the tapered optical fiber or the waveguide connected on one side with one or several multiple longitudinal mode lasers also enables coupling with one or several microresonators simultaneously. For example, the tapered optical fiber may be coupled by its bottleneck part simultaneously with two toroidal microresonators from the opposite sides. The waveguide arranged with microresonators on the same semiconductor chip may be simultaneously coupled to three or more microresonators located at a subwavelength distance from it.

Figure 2:
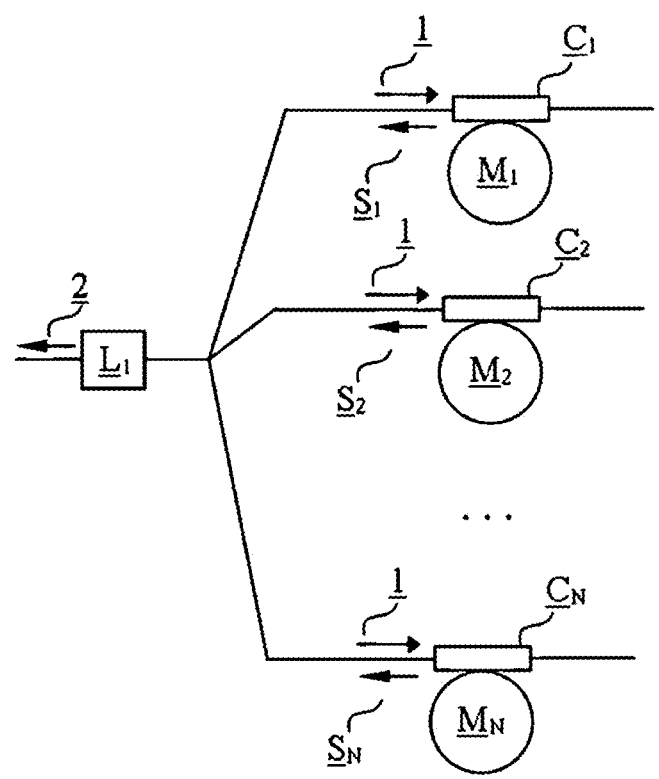
FIG. 2 shows schematically an example of one multiple longitudinal mode laser $L_1$ simultaneously locked to several parallel high-Q microresonators $M_1 \ldots M_N$ through the several coupling elements $C_1 \ldots C_N$.

FIG. 2 shows schematically an example of one multiple longitudinal mode laser $L_1$ simultaneously locked to several parallel high-Q microresonators M1 . . . $M_N$, for example, WGMs microresonators, through several coupling elements $C_1$ . . . $C_N$. Laser light 1 having a spectrum of multiple longitudinal modes is split so that each high-Q microresonator receives the laser light 1. The tuner tunes the spectrum of multiple longitudinal modes of the laser light 1 to match each of at least one frequency of an individual longitudinal mode of the longitudinal mode laser $L_1$ with a resonance frequencies of several high-Q microresonators $M_1$ . . . $M_N$ so as to obtain at least one matched frequency. For example, four matched frequencies may be obtained for one laser $L_1$ and three high-Q microresonators $M_1$, $M_2$, $M_3$, wherein a first matched frequency may be obtained for laser $L_1$ and high-Q microresonator $M_1$, a second and third matched frequencies may be obtained for laser $L_1$ and high-Q microresonator $M_2$, a fourth matched frequency may be obtained for laser $L_1$ and high-Q microresonator $M_3$. Different combinations are also possible. Each high-Q microresonator $M_1 \ldots M_N$ may provide generation of one or several counter-propagating modes each at one of the at least one matched frequency. In particular, as indicated above for the example with one laser $L_1$ and three high-Q microresonators $M_1$, $M_2$, $M_3$, each of high-Q microresonators $M_1$ and $M_3$ may generate one counter-propagating mode and high-Q microresonator $M_2$ generate two counter-propagating modes at respective matched frequencies. Said one or several counter-propagating modes (mode-s) may be coupled back to the multiple longitudinal mode laser $L_1$ in the form of light wave(s) $S_1 \ldots S_N$ that provides an optical feedback and a redistribution of a power of the multiple longitudinal mode laser $L_1$ in favor of at least one dominant longitudinal laser mode each at one of the matched frequency and at a reduced linewidth of the dominant longitudinal laser mode. In particular, as indicated above for the example with one laser $L_1$ and three high-Q microresonators $M_1$, $M_2$, $M_3$, power of the multiple longitudinal mode laser L1 may be redistributed in favor of four dominant longitudinal laser modes with reduced linewidths.

Figure 3:
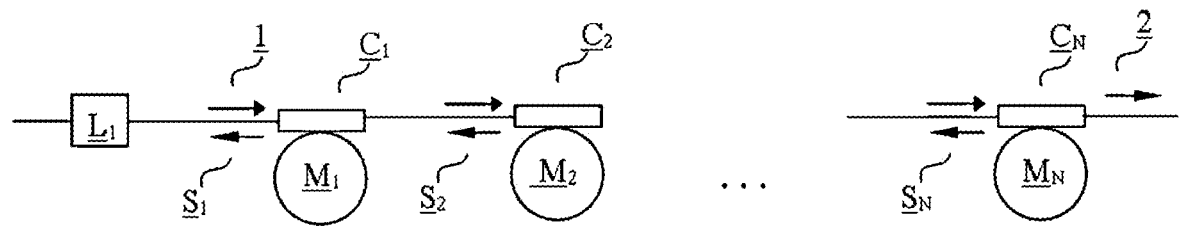
FIG. 3 shows schematically another example when one multiple longitudinal mode laser $L_1$ is simultaneously locked to several serial high-Q microresonators $M_1 \ldots M_N$ through several coupling elements $C_1 \ldots C_N$.

FIG. 3 shows schematically another example when a multiple longitudinal mode laser $L_1$ is simultaneously locked to several serial high-Q microresonators $M_1 \ldots M_N$, for example, WGMs microresonators, through several coupling elements $C_1 \ldots C_N$. Each high-Q microresonator $M_1 \ldots M_N$ is coupled to a bus waveguide and receives a laser light 1 having a spectrum of multiple longitudinal modes. The tuner may tune the spectrum of multiple longitudinal modes of the laser light 1 to match each of at least one frequency of an individual longitudinal mode with a respective resonance frequency of high-Q mode of several high-Q microresonators $M_1 \ldots M_N$ so as to obtain at least one matched frequency. Each high-Q microresonator $M_1 \ldots M_N$ may provide generation of one or several counter-propagating modes each at one of the at least one matched frequency. Light waves(s) $S_1 \ldots S_N$ resonantly backscattered from the high-Q microresonators $M_1 \ldots M_N$ may provide an optical feedback and a redistribution of a power of the multiple longitudinal mode laser $L_1$ in favor of one or several dominant longitudinal laser modes each at one of the at least one matched frequency and at a reduced linewidth of the dominant longitudinal laser mode. Each of light wave(s) $S_1 \ldots S_N$ may be in a resonance with only one high-Q microresonator to eliminate their interaction.

Figure 4:
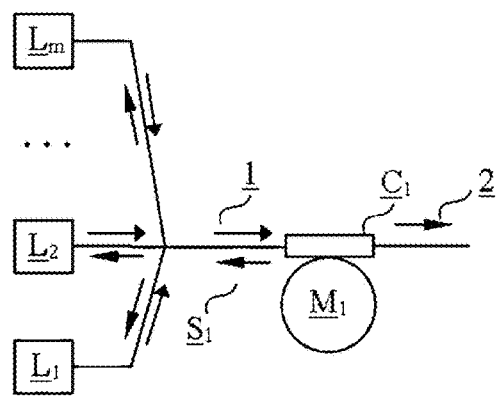
FIG. 4 schematically demonstrates yet another example when several multiple longitudinal mode lasers $L_1 \ldots L_m$ simultaneously locked to one high-Q microresonator $M_1$.

FIG. 4 schematically demonstrates yet another embodiment when several multiple longitudinal mode lasers $L_1$, $L_2$, $\ldots L_m$ are simultaneously locked to one high-Q microresonator $M_1$, for example, one WGMs microresonator. A laser light 1 may be combined and coupled to the high-Q microresonator $M_1$ through the coupling element $C_1$. High-Q microresonator $M_1$ receives the laser light 1 having a spectrum of multiple longitudinal modes. The tuner may tune the spectrum of multiple longitudinal modes of the laser light 1 to match each of at least one frequency of an individual longitudinal mode with a respective resonance frequency of the high-Q microresonator $M_1$ so as to obtain at least one matched frequency. For example, three matched frequencies may be obtained for three lasers $L_1$, $L_2$, $L_m$ and one high-Q microresonator $M_1$, wherein a first matched frequency may be obtained for laser $L_1$ and high-Q microresonator $M_1$, a second matched frequency may be obtained for laser $L_2$ and high-Q microresonator $M_1$ and a third matched frequency may be obtained for laser $L_m$ and high-Q microresonator $M_1$. Light wave(s) $S_1$ resonantly backscattered from the high-Q microresonator $M_1$ at the matched frequencies provide an optical feedback to each of the lasers and a redistribution of a power of each of the multiple longitudinal mode lasers $L_1$, $L_2$, $L_m$ in favor of respective dominant longitudinal laser modes at matched frequencies and at reduced linewidths.

Figure 5:
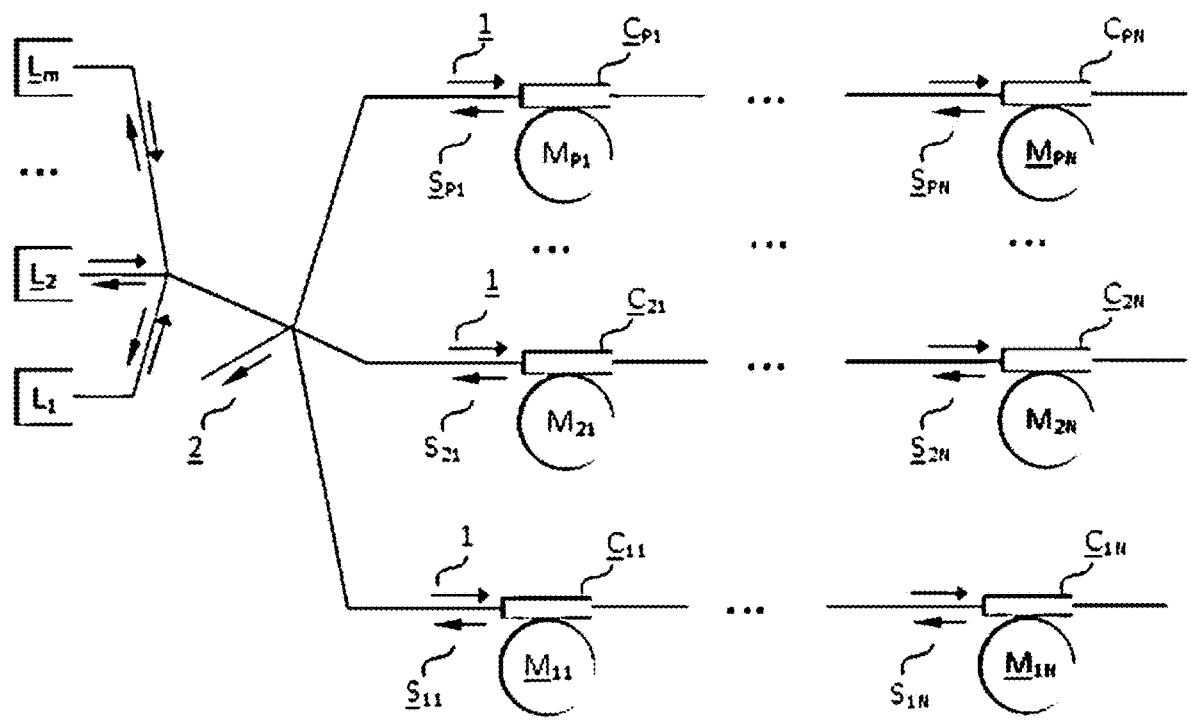
FIG. 5 shows an example of scheme with several multiple longitudinal mode lasers $L_1 \ldots L_m$ simultaneously locked to several parallel and serial $N^xP$ high-Q microresonators $M_{PN}$.

FIG. 5 shows the scheme of another embodiment when several multiple longitudinal mode lasers $L_1 \ldots L_m$ are simultaneously locked to several parallel and serial high-Q microresonators $M_{PN}$, for example, WGMs microresonators, through coupling elements $C_{PN}$. As in the above embodiments, each of the high-Q microresonators $M_{PN}$ may receive the laser light 1 from the several multiple longitudinal mode lasers $L_1 \ldots L_m$ having a spectrum of multiple longitudinal modes. The tuner may tune the spectrum of multiple longitudinal modes of the laser light 1 to match each of at least one frequency of an individual longitudinal mode with a respective resonance frequency of the high-Q microresonators $M_{PN}$ so as to obtain at least one matched frequency. Resonance backscattering $S_{PN}$ from the high-Q microresonator $M_{PN}$ at the at least one matched frequency may provide an optical feedback and a redistribution of a power of each of the multiple longitudinal mode lasers $L_1 \ldots L_m$ in favor of respective dominant longitudinal laser mode each at one of the at least one matched frequency and at a reduced linewidth of the dominant longitudinal laser mode.

The embodiment is not limited by the variants shown in FIGS. 1 to 5. Other configurations based on combinations of one or several variants of FIGS. 2 to 4 are also possible. For example, the laser device may include several parallel components as indicated in FIG. 2 each of which includes the multiple longitudinal mode laser $L_1$ simultaneously locked to several serial high-Q microresonators $M_1 \ldots M_N$ through several coupling elements $C_1 \ldots C_N$ as indicated in FIG. 3. In addition, the coupling element C may be configured in the form of a tapered optical fiber or a waveguide. In such case, as explained above, one or several of the at least one multiple longitudinal mode laser may be optically feedback coupled to one or several of the at least one high-Q microresonator through the one of the said coupling elements.

Figure 6A:
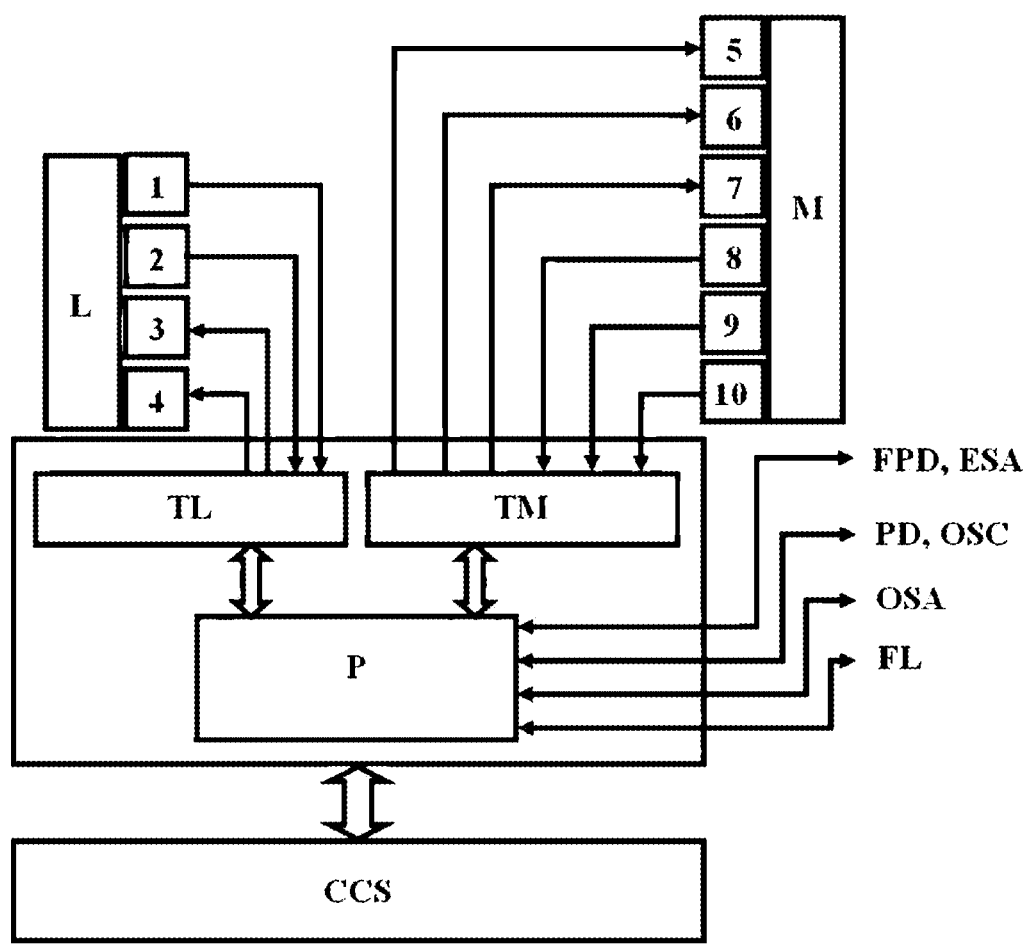
FIG. 6A illustrates a configuration of a tuner according to an embodiment.

In one embodiment, the tuner TU (see FIG. 1A) may include a plurality of subunits TL and TM each of which may be associated with each of the at least one laser (L) and the at least one high-Q microresonator (M) or may be configured as a single unit associated with each of the at least one laser and the at least one high-Q microresonator. Other configurations of the tuner TU may be also possible. The tuner may be configured to control parameters of the at least one laser, for example, an injection current and/or temperature of a laser active medium of the at least one laser. For example, the tuner may be configured to control said parameters of each of the at least one multiple longitudinal mode laser individually. In addition, the tuner may be configured to control parameters of the at least one high-Q microresonator, for example, its temperature, an external pressure applied to the at least one high-Q microresonator, an electromagnetic field applied to the at least one high-Q microresonator in case, if the last is made of an electro-optical material. For example, the tuner may be configured to control said parameters of each of the at least one high-Q microresonator individually. The tuner may be provided with or connected with such measuring equipment as temperature sensors, pressure sensors, electromagnetic field sensors, current controllers which are used when spectrum tuning. The tuner may further communicate with measuring equipment for controlling spectrum transformations such as photodetectors, optical spectrum analyzers, electrical spectrum analyzers, oscilloscopes and their analogs, reference narrow linewidth lasers for measurement of dominant longitudinal modes linewidths and so on. The tuner TU may be also connected or include controlling equipment such as heating elements, current controllers, pressing piezo ceramics, radiofrequency antennas or capacitor plates and waveguides connected with the at least one high-Q microresonator and delivering external electromagnetic field thereto to change its resonance frequencies. The said measuring and controlling equipment may be configured for measuring and changing the above mentioned parameters of the at least one laser and/or the at least one high-Q microresonator. In one embodiment, the tuner may further include a processor configured to provide an analytical feedback between the measuring and controlling equipment to tune the spectrum of multiple longitudinal modes of the at least one laser and/or to tune the spectrum of resonance frequencies of high-Q modes of the at least one high-Q microresonator so as to obtain matched frequencies. The processor may be operatively coupled to a computer control system which may be programmed to control the tuner in a predetermined manner to optimize its operation According to an example embodiment illustrated in FIG. 1A, where the laser device includes one laser L and one high-Q microresonator M, the tuner TU may be configured as shown in FIG. 6A. The tuner TU may include two subunits TL, TM associated with the laser L and the high-Q microresonator M, respectively, for controlling their parameters as mentioned above.

Figure 6B:
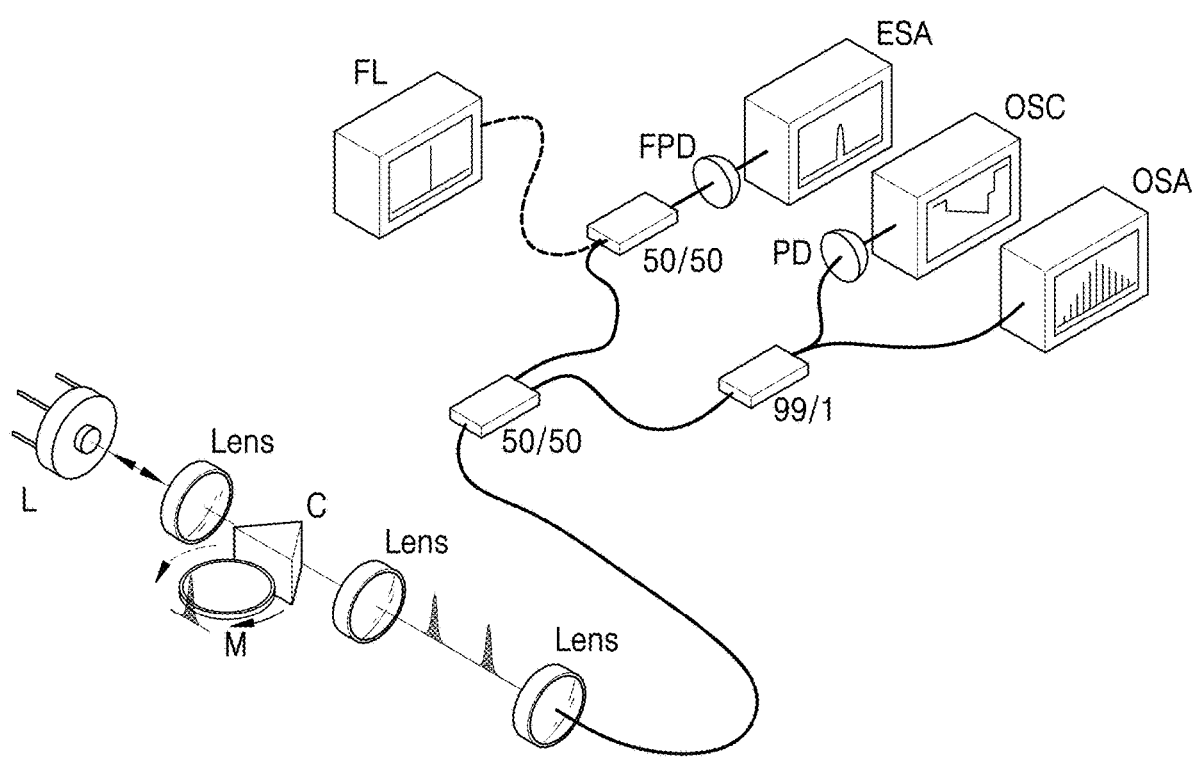
FIG. 6B shows an example of a scheme of measuring equipment used for controlling spectrum transformations.

FIG. 6B shows an example of a part of a scheme of measuring equipment used for controlling spectrum transformations. The laser light from a multiple longitudinal mode indium phosphide (InP) laser diode L may be collimated using lens "Lens" (first along the laser beam on the FIG. 6A) and coupled to a magnesium fluoride ($MgF_2$) high-Q microresonator M through a coupling element C such as a glass total internal reflection coupling prism. Resonantly backscattered Rayleigh radiation may return to the multiple longitudinal mode diode laser L and may force self-injection locking of the laser frequency to the resonance frequency of the high-Q microresonator M. The output laser light having an output spectrum may be collimated to a single-mode fiber using two lenses (second "Lens" and third "Lens" along the laser beam on the FIG. 6B) and analyzed with an optical spectrum analyzer OSA, on a photodiode PD with an oscilloscope OSC, and a fast photodiode FPD with an electrical spectrum analyzer ESA. A beamsplitter 50/50 may be used to split the output laser signal equally between OSA and ESA. A sensitive oscilloscope OSC may accept about 1% of laser energy intended for OSA using a 99/1 beamsplitter. A repetition rate of soliton pulses may be monitored by the fast photodiode FPD and the electrical spectrum analyzer ESA. Detuning a laser frequency from an optical resonance may be monitored on the photodiode PD with the oscilloscope OSC. A narrow-linewidth tunable fiber laser FL may be used for heterodyne linewidth measurements.

In one of embodiments, the subunit TL of the tuner TU (as indicated in FIGS. 1A, 6A, and 6B) may receive data measured by a current sensor 1 and/or a temperature sensor 2 and send them to the processor P. The subunit TM of the tuner TU may receive data measured by a pressure sensor 8, a temperature sensor 9 and/or an electromagnetic field sensor 10 and send them to the processor P. The processor P may be also configured to communicate with the optical spectrum analyzer OSA, the photodiode PD with the oscilloscope OSC, the fast photodiode FPD with the electrical spectrum analyzer ESA and the narrow linewidth laser reference laser FL to control spectrum transformations, for example to measure the dominant longitudinal mode's linewidth in the self-injection locking regime. The processor P may provide an analytical feedback between the measuring and controlling equipment. For example, the processor P may send a control signal to a current controller 3 to change a laser injection current of the multiple longitudinal mode laser L associated thereto, and/or the processor P may send a control signal to a heating element 4 to change a temperature of the laser active medium of the multiple longitudinal mode laser L associated thereto in order to tune the spectrum of the multiple longitudinal mode laser L so as to obtain one or several matched frequencies. The processor P may send a control signal to a pressing piezo ceramics 5 to change a pressure applied to the high-Q microresonator M associated thereto, and/or the processor P may send a control signal to a heating element 6 to change a temperature of the high-Q microresonator M associated thereto in order to tune the spectrum of high-Q modes of the at least one high-Q microresonator M so as to obtain matched frequencies. In addition, if the high-Q microresonator M is made of an electro-optical material, the processor P may send a control signal to an electromagnetic field controller 7 to change an electromagnetic field applied to the high-Q microresonator M associated thereto in order to tune the spectrum of high-Q modes of the at least one high-Q microresonator M so as to obtain one or several matched frequencies. The computer control system CCS may be programmed to control the tuner TU in a predetermined manner to optimize its operation.

In the embodiment presented in FIG. 2, the tuner may be configured as including one subunit TL associated with the multiple longitudinal mode laser $L_1$ and N subunits TM associated with each of high-Q microresonators $M_1 \ldots M_N$. In the embodiment presented in FIG. 5, the tuner may be configures as including M subunits TL associated with each of multiple longitudinal mode lasers $L_1 \ldots L_m$ and P*N subunits TM associated with each of high-Q microresonators $M_{PN}$. However, other configurations are also possible. For example, in the embodiment of FIG. 2, the tuner may include two subunits TL and TM, wherein subunit TM may be associated with all high-Q microresonators $M_1 \ldots M_N$.

Figure 7:
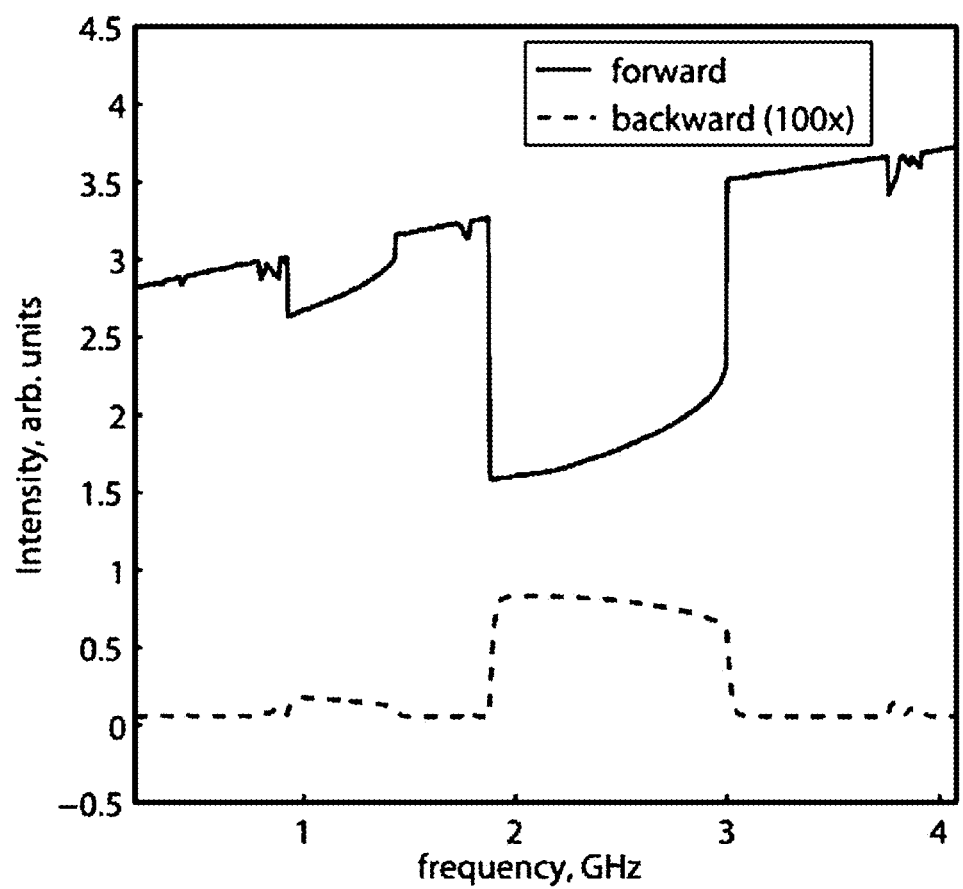
FIG. 7 shows an oscillogram of a signal of a photodetector D from FIG. 1 (solid curve) while a frequency of the multiple longitudinal mode laser L is swept along the axis of abscissa and a power of the resonance Rayleigh backscattering (dashed curve)

In the above-described embodiment, the spectrum of multiple longitudinal modes of the laser light may be slightly tuned TL at frequency domain by adjusting a laser injection current to achieve matching each of one or several frequencies of individual longitudinal modes of the at least one multiple longitudinal mode laser L, for example, each of the at least one multiple longitudinal mode laser individually, with a respective resonance frequency of the high-Q microresonator M by means of the tuner TU (see FIG. 1). In FIG. 7, tuning the spectrum of multiple longitudinal modes of the laser light is shown as a signal (solid curve) from photodetector D (see FIG. 1A). Transmission drops shown on the signal are the resonances of high-Q microresonator. Sharp edges of the resonances are due to the laser frequency is pulled away from the frequency sweep when the laser locks to the microresonator's resonance frequency modes. A power of the resonance Rayleigh backscattering propagating in the form of counter-propagating modes (mode-s) (as indicated in FIG. 1A) which is responsible for optical feedback and laser spectrum narrowing when it is coupled out from the high-Q microresonator is shown on the same FIG. 7 (dashed curve) where the Rayleigh backscattering power is increased by a factor 100 to be compared with the LD's power on the same scale. Pick of the power of resonance Rayleigh backscattering may correspond to a resonance frequency of the high-Q microresonator when the laser frequency adjusted by a laser injection current. When the laser injection current is not swept and frequency of one of the longitudinal laser mode is tuned to match with a resonance frequency of the high-Q microresonator, the process of laser longitudinal mode competition in conditions of resonance optical feedback may be launched.

Figure 8:
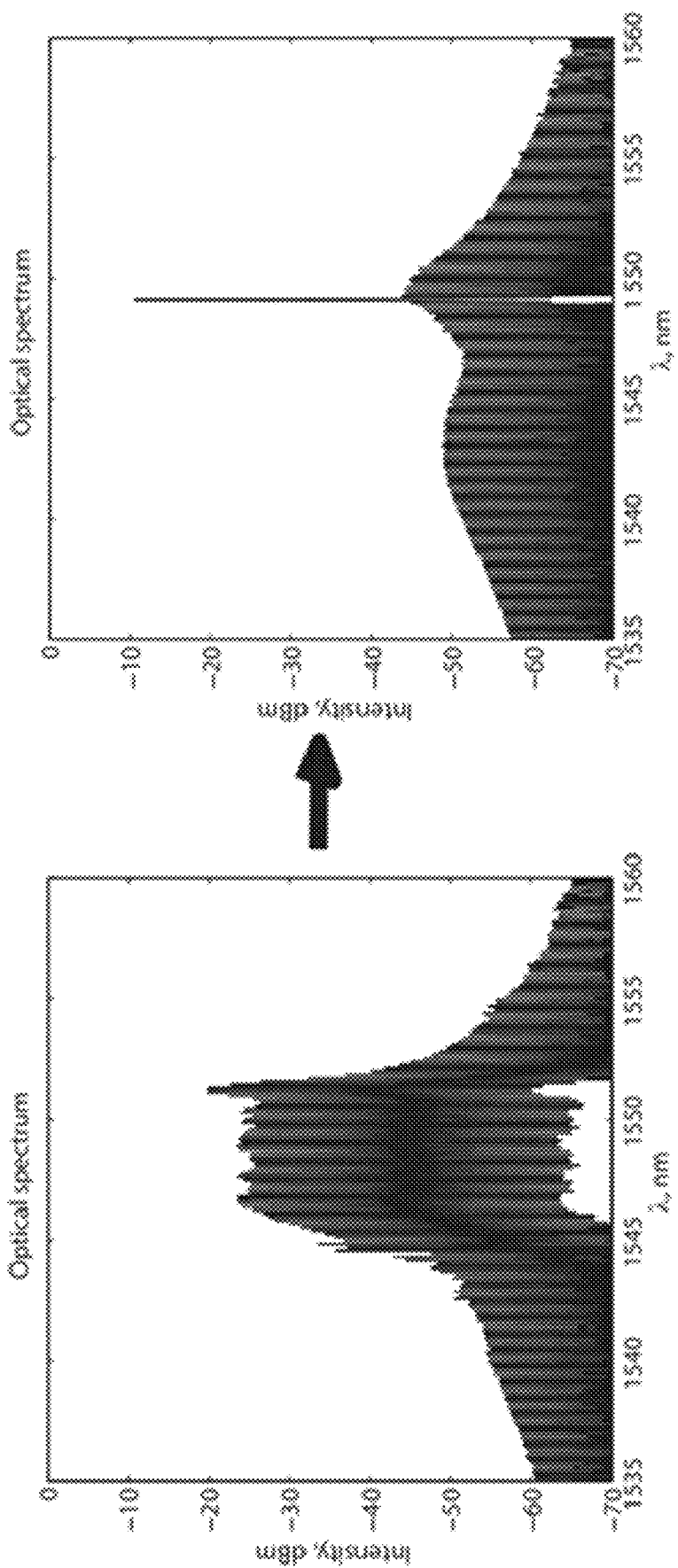
FIG. 8 shows an example of transforming a spectrum of multiple longitudinal modes of the longitudinal mode laser to an output spectrum of an output laser light produced by the laser device, the spectrum has one dominant longitudinal laser mode when one frequency of an individual longitudinal mode matches to one resonance frequency of the high-Q microresonator.

A result of acting the mode competition in conditions of optical feedback is illustrated on FIG. 8 where an example of transforming a spectrum of a free-running multiple longitudinal mode near-infrared laser (shown left) including a plurality of longitudinal modes in the range from about 1535 nm to about 1560 nm spaced by about 0.14 nm (corresponding to ~17 GHz in the frequency domain) into an output spectrum having one dominant longitudinal mode (shown right) is presented. When one frequency of one individual longitudinal mode of the spectrum of multiple longitudinal modes matches to one resonance frequency of the high-Q microresonator, a power of many longitudinal modes may redistribute in favor of one dominant longitudinal laser mode additionally narrowed by the high-Q microresonator, a few thousand times whose power may be significantly increased (FIG. 8).

In one embodiment when the laser injection current is not swept, a spectrum of multiple longitudinal mode of the laser light may be tuned by the tuner TU by means of changing a temperature of a laser active medium of the at least one multiple longitudinal mode laser, for example, each of the at least one multiple longitudinal mode laser individually, that may lead to changing its refractive index and hence to changing a spacing of the longitudinal modes at the frequency domain and changing a frequency of each of the individual longitudinal modes.

In yet another embodiment when the laser injection current is not swept and the temperature of the laser active medium is stable, the tuner TU may be configured to tune resonance frequencies of high-Q modes of the at least one high-Q microresonator M that allows further tuning the at least one matched frequency in conditions of the optical feedback. The tuner is capable to both control a spacing of the high-Q modes at the frequency domain and control a frequency of each of the individual high-Q modes of the at least one high-Q microresonator by means of controlling a temperature or/and external pressure applied to the high-Q microresonator. Both options may lead to changing a refractive index and/or dimensions of the at least one high-Q microresonator, for example, of each of at least one high-Q microresonator individually, and hence to changing its resonance frequencies and/or the spacing of the high-Q modes.

In another embodiment, the at least one high-Q microresonator may be made of an electro-optical material changing its refractive index in response of an applied electromagnetic field, and the tuner TU may be further configured to control an electromagnetic field applied to the at least one high-Q microresonator, for example, of each of at least one high-Q microresonator individually. Changing a refractive index of the at least one high-Q microresonator leads to changing its resonance frequencies, wherein the tuner is capable for tuning resonance frequencies of the at least one high-Q microresonator that allows further tuning the at least one matched frequency in conditions of the optical feedback. As examples of electro-optical materials for high-Q microresonator fabrication, lithium niobate and indium phosphide may be mentioned.

Figure 9A:
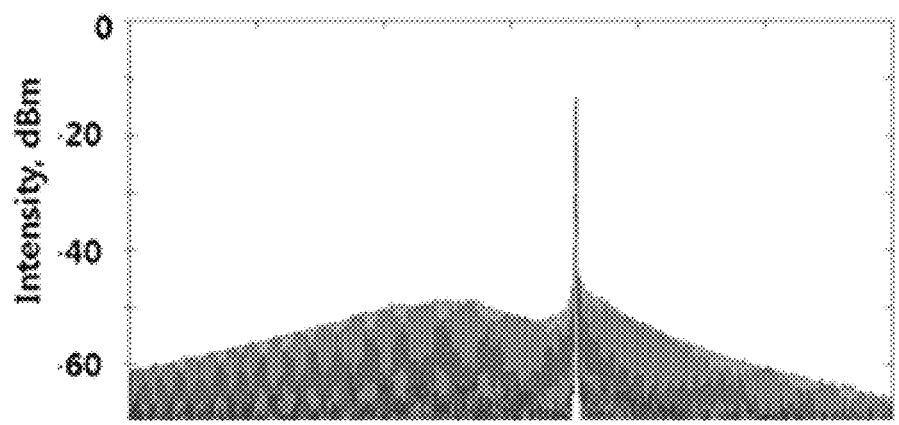
FIG. 9A demonstrates a result of transforming a spectrum of at least one multiple longitudinal mode laser locked to at least one high-Q microresonator when one frequency of an individual longitudinal mode matches to one resonance frequency of the at least one high-Q microresonator.
Figure 9B:
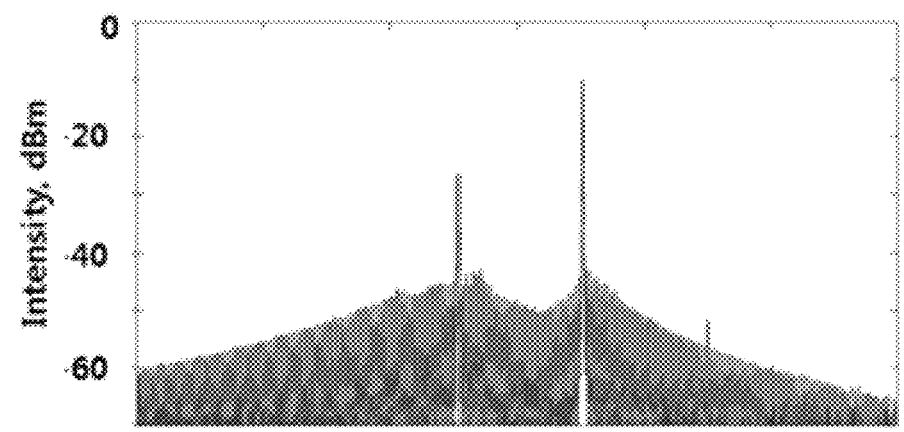
FIG. 9B demonstrates a result of transforming a spectrum of the at least one multiple longitudinal mode laser locked to the at least one high-Q microresonator when two frequencies of an individual longitudinal modes match to two resonance frequencies of the at least one high-Q microresonator.
Figure 9C:
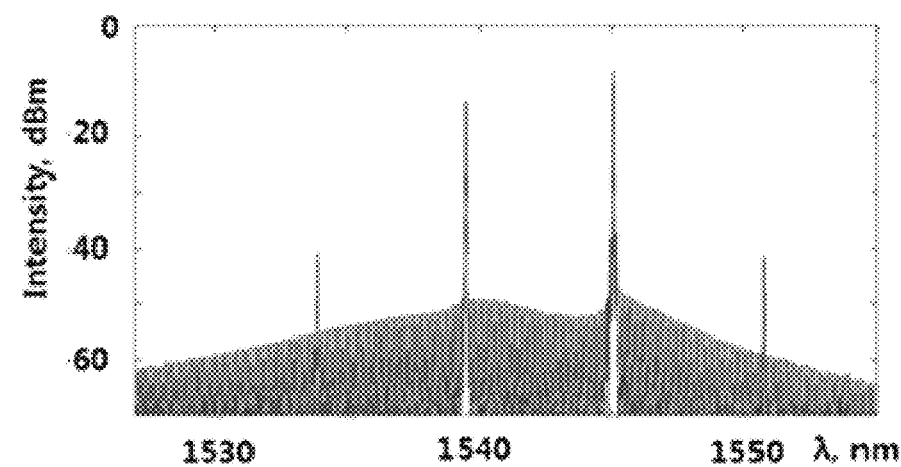
FIG. 9C demonstrates a result of transforming a spectrum of the at least one multiple longitudinal mode laser locked to the at least one high-Q microresonator when four frequencies of individual longitudinal modes matches to four resonance frequencies of the at least one high-Q microresonator.

FIGS. 9A to 9C demonstrate results of transforming a spectrum of at least one multiple longitudinal mode laser locked to at least one high-Q microresonator when each of one or simultaneously several frequencies of individual longitudinal modes of the at least one laser is matched with a respective resonance frequency of the at least one high-Q microresonator. In cases of FIGS. 9B and 9C, longitudinal mode competition in conditions of optical feedback provides a simultaneous generation of several narrow laser lines.

FIG. 9A demonstrates a single frequency generation when one frequency of an individual longitudinal mode of the at least one multiple longitudinal mode laser L matches to one resonance frequency of the at least one high-Q microresonator M. In this case, an output laser light having an output spectrum with one dominant longitudinal laser mode may be produced by the laser device. FIG. 9B demonstrates two-frequency generation when two frequencies of individual longitudinal modes of the at least one multiple longitudinal mode laser L match to two resonance frequencies of the at least one high-Q microresonator M. In this case, an output laser light having an output spectrum with two dominant longitudinal laser modes may be produced by the laser device. FIG. 9C demonstrates example of four-frequency lasing when four frequencies of individual longitudinal modes of the at least one multiple longitudinal mode laser L match to four resonance frequencies of the at least one high-Q microresonator M. In this case, an output laser light having an output spectrum with four dominant longitudinal laser modes may be produced by the laser device. As explained above, a power of the at least one multiple longitudinal mode laser may redistribute in favor of one or several narrow laser lines as a result of mode competition in conditions of resonance optical feedback.

In the embodiments illustrated above in FIG. 9B to 9C, several individual longitudinal modes of the spectrum of multiple longitudinal modes may transform into the several dominant longitudinal modes at a reduced linewidths of the dominant longitudinal laser modes as a result of optical feedback coupling the at least one multiple longitudinal mode laser to the at least one high-Q microresonator and tuning the spectrum of multiple longitudinal modes to match each of several frequencies of individual longitudinal modes with a respective resonance frequency of the at least one high-Q microresonator so as to obtain several matched frequencies. Such embodiments provide a great flexibility of several narrow-linewidth lasing at different frequencies required for specific applications, because of generation of several narrow laser lines may refer to different multiple longitudinal mode lasers and different high-Q microresonators as indicated in FIGS. 2 to 5. It enables engineering of output spectrum consisting of narrow laser lines at arbitrary frequencies required for specific applications by properly choosing of multiple longitudinal mode lasers and high-Q microresonators with specific frequencies to be tuned.

Figure 1B:
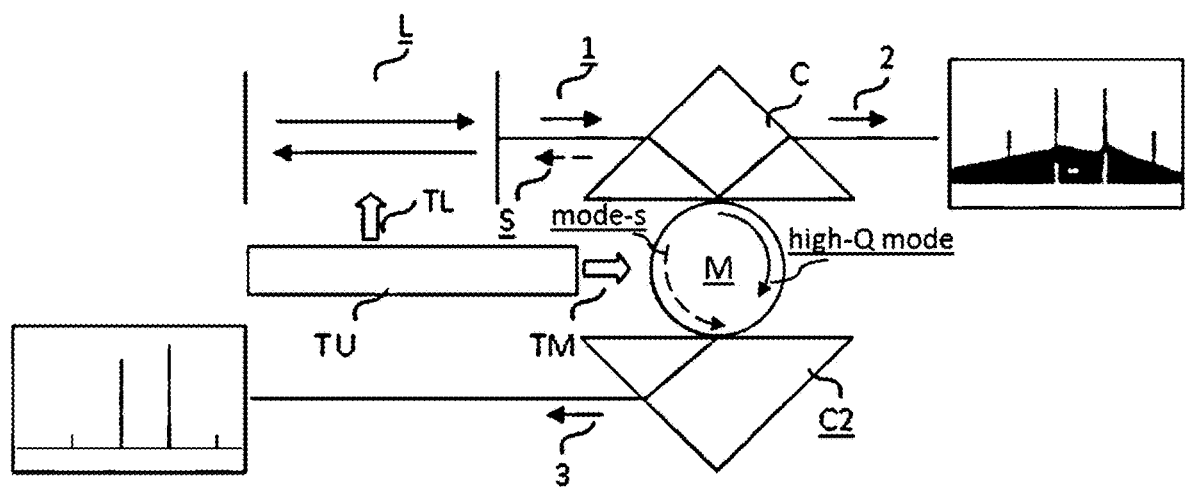
FIG. 1B shows one multiple longitudinal mode laser L coupled to one optical high-Q microresonator M using the coupling element C. An additional coupling element C2 may be used to filter out a non-resonant part of a generated laser light.

In one of the embodiments, the one or several dominant longitudinal laser modes may be coupled out from the high-Q microresonator M through an additional coupling element C2 (see FIG. 1B) being a total internal reflection prism. In other embodiments, one or several of the at least one high-Q microresonator M may be provided with one additional coupling element C2 in the form of the tapered optical fiber or waveguide used instead of total internal reflection prism schematically shown in the FIG. 1B. Use of additional coupling element may significantly improve a spectral purity of an output spectrum of output laser light produced by the laser device and including dominant longitudinal laser modes by filtering out a non-resonant part of the output spectrum. The spectral purity of the output spectrum is often required for many microphotonic applications. In FIG. 1B, laser light 1 and the laser light 2 having the output spectrum may be coupled out from the high-Q microresonator M through the coupling element C (the total internal reflection prism), as indicated right, said laser light 1 and laser light 2 may include weak non-resonant laser longitudinal modes. Additional coupling prism C2 may provide coupling out from the high-Q microresonator M a laser light 3 having a pure spectrum consisting of dominant longitudinal laser modes only without of the non-resonant part of the output laser light (as indicated left). In other words, the laser light 3 may have dominant longitudinal laser modes with a higher side mode suppression ration (SMSR) parameter then explained above as compared with the laser light 2. In this case, the SMSR may be in the range of about 40-70 dB, for example, in the range of about 50-70 dB. For example, about 60 dB may often provide a sufficient value of side mode suppression ratio for the purposes of these applications.

According to other exemplary embodiments, when the at least one high-Q microresonator is made of a material having an intensity-dependent refraction index, and wherein the laser device may be further configured to produce at least one optical frequency comb, wherein each of the at least one optical frequency comb may be parametrically generated by one of the at least one dominant longitudinal laser mode, if the at least one dominant longitudinal laser modes has a power above a pump threshold of an optical frequency comb generation. There are many examples of materials having intensity-dependent refraction index such as fluorides transparent in a wide spectral range: calcium fluoride, barium fluoride and magnesium fluoride. Also worth mentioning quartz, silicon, silicon nitride, diamond and others.

Figure 10A:
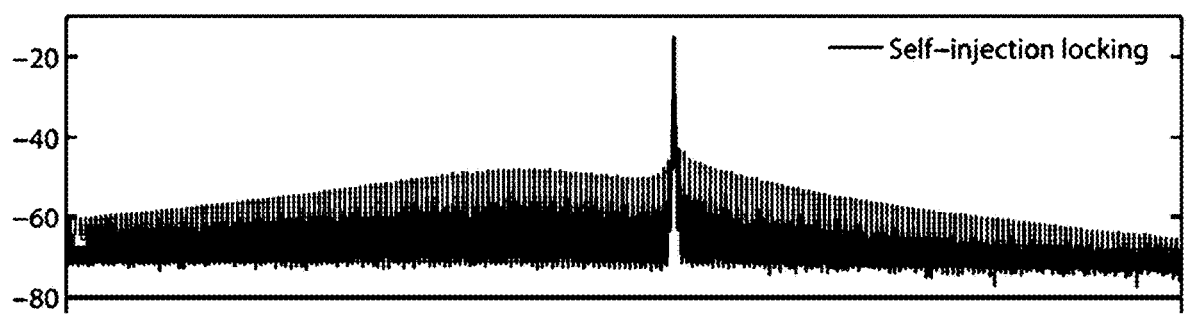
FIG. 10A shows a result of transforming a spectrum of a multiple longitudinal mode laser locked to a magnesium fluoride high-Q microresonator with generation of one dominant longitudinal laser mode.
Figure 10B:
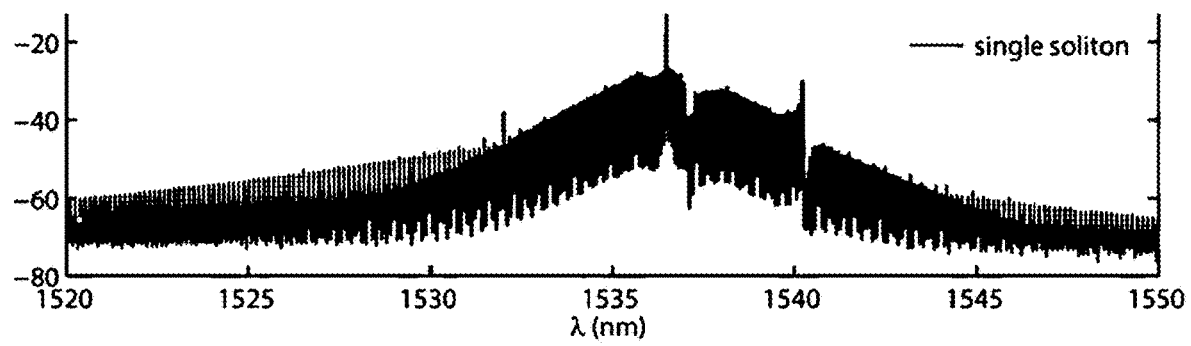
FIG. 10B shows an example of an optical spectrum of a parametrically generated optical frequency comb in case of FIG. 9A.

FIG. 10A shows an example of transforming a spectrum of a multiple longitudinal mode laser locked to a high-Q magnesium fluoride WGMs microresonator with generating a single dominant longitudinal laser mode with reduced linewidth as explained above because only one frequency of an individual longitudinal mode is matched to one resonance frequency of the high-Q magnesium fluoride WGMs microresonator so as to obtain one matched frequency. Mode competition in condition of optical feedback like in the optical scheme of FIG. 1A has led to redistribution of laser power in favor of one dominant longitudinal laser mode at the matched frequency. Side mode suppression ration is about 30 dB. Next, in the FIG. 10B the output laser light with the output spectrum having one dominant longitudinal laser mode effectively coupled to the high-Q microresonator with a power level above pump threshold may parametrically generate dissipative a Kerr soliton comb (DKS). The Kerr soliton comb is an optical frequency comb having a plurality of spectral modes spaced by a fixed value of a frequency different from a spacing of the laser longitudinal mode. FIG. 10B demonstrates the signal immediately after the coupling prism C in the optical scheme of FIG. 1A. The signal combines laser light 2 coming from the high-Q microresonator M and the non-resonant laser light 2 passed from the multiple longitudinal mode laser L through the coupling prism C. In the above-described embodiment when cleaned optical frequency comb is required, the additional coupling element C2 may be used (FIG. 1b) to filter out a non-resonant part of the output spectrum.

The specific measured data demonstrated in FIGS. 10A and 10B were obtained using a high-Q magnesium fluoride ($MgF_2$) WGMs microresonator with a diameter of about 5.5 mm and an edge curvature radius of about 500 μm, corresponding to a free spectral range (FSR) of ~12.5 GHz (inverse of the pulse round-trip time in the microresonator). The magnesium fluoride refraction index depends on laser intensity allowing the generation of DKS. The high-Q microresonator was manufactured by precise single-point diamond turning of the bulk crystal. An ultrahigh intrinsic Q-factor exceeding $10^9$ was achieved by polishing with diamond slurries. The laser diode used to obtain specific measured data in FIGS. 10A and 10B has an optical spectrum consisting of tens of longitudinal modes covering ~10 nm, with a spacing of longitudinal modes f=17.68 GHz around the central wavelength of about 1,535 nm and about 200 mW maximum output power. The intensity in the laser gain region is approximately uniformly distributed between the lines. By gradually changing an injection current, one of longitudinal laser modes was matched to microresonator's resonance mode for obtaining an optical feedback and one dominant longitudinal mode with reduced linewidth.

Next, by gradually detuning the diode laser frequency in lower frequencies side with the injection current, but staying in the locked regime, it was possible to smoothly switch the system into a soliton comb regime (predominantly the single-soliton one) with a very characteristic sech2(x) envelope (FIG. 10B). The soliton comb has a span of ~30 nm with a line spacing of about 12.5 GHz corresponding to microresonator's free spectral range. Additional residual laser lines separated by about 17.68 GHz are visible in the optical spectrum, although they are weak and may be filtered out in the drop-port configuration with additional coupling element (see FIG. 1B).

Figure 11A:
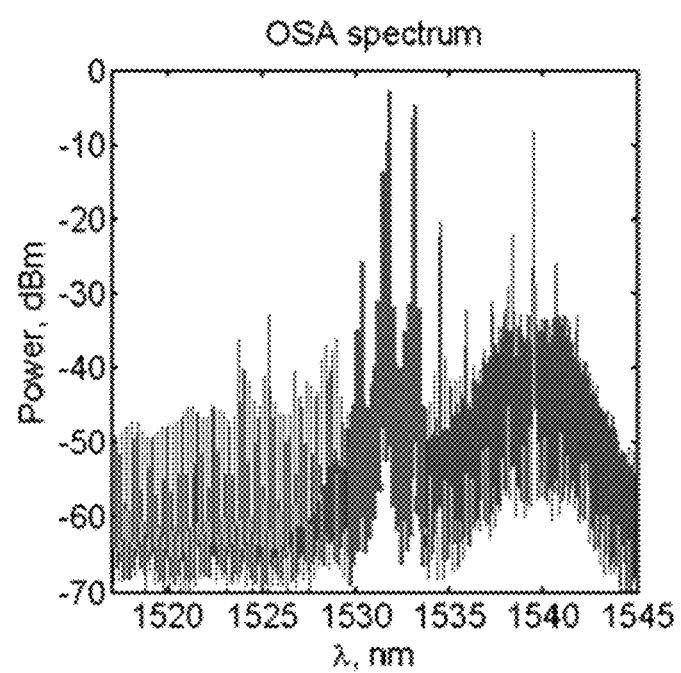
FIG. 11A shows an optical spectrum of two simultaneously generated optical frequency combs (a curve in the middle portion of FIG. 11A and a curve in the other portion thereof) in case when a multiple longitudinal mode laser diode locked to a magnesium fluoride high-Q microresonator with generation of two dominant longitudinal laser mode pumping the parametrically generated frequency combs.
Figure 11B:
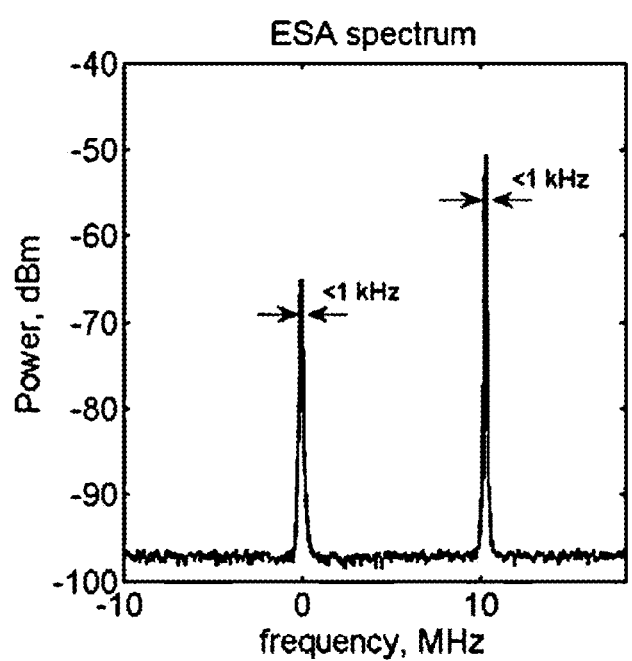
FIG. 11B shows a spectrum of radio frequency beating of narrow modes of the combs.

Other exemplary embodiments include variants when several optical frequency combs may be generated by several dominant longitudinal laser modes. FIG. 11A shows an optical spectrum of two simultaneously generated optical frequency combs (a curve in the middle portion of FIG. 11A and a curve in the other portion thereof) in case of a multiple longitudinal mode laser diode locked to a high-Q magnesium fluoride WGMs microresonator with generation of dominant longitudinal laser modes pumping the parametrically generated frequency combs. First as before a laser light having a spectrum of multiple longitudinal modes is tuned to match two frequencies of the longitudinal modes with two resonance frequencies of the high-Q microresonator so as to obtain two matched frequencies. The high-Q microresonator receives individual longitudinal modes of the laser light at the matched frequencies corresponding to its resonance frequencies to provide an optical feedback due to Rayleigh backscattering. Mode competition in conditions of the optical feedback may lead to redistribution of the laser power in favor of the two dominant longitudinal modes at two matched frequencies. When power of the dominant modes exceeds the pump threshold, the optical frequency comb may be generated. Each of the combs is a plurality of the narrow spectral modes spaced by a fixed value of a frequency different from the spacing of the laser longitudinal modes. FIG. 11B shows a spectrum of radio frequency beating of narrow modes of the combs measured using fast photodiode and electrical spectrum analyzer. There are two beatnotes corresponding to the combs. Linewidths of the beatnotes are lower than 1 kHz that demonstrates the narrowness of the frequency combs' modes. Narrow spectral modes of the two combs spaced by different values of frequency with the difference about 10 MHz.

Figure 12A:
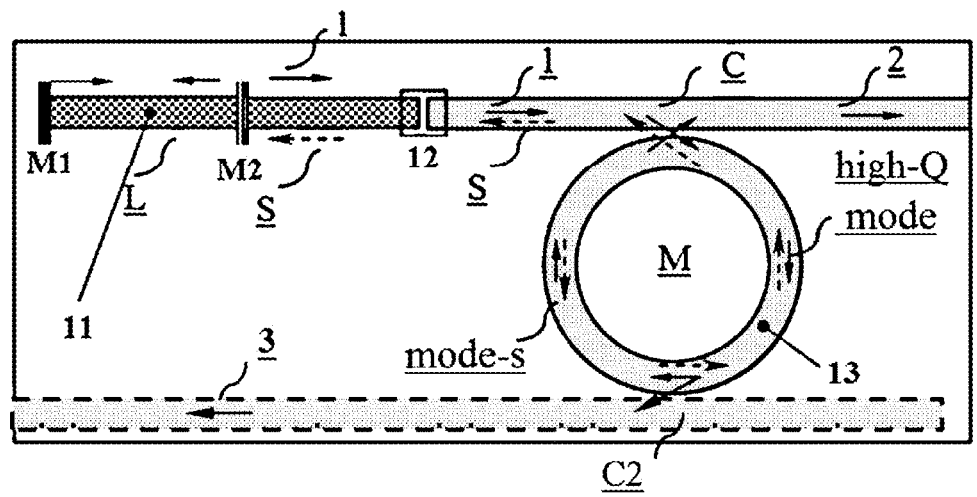
FIG. 12A schematically demonstrates the top view of a laser device with at least one multiple longitudinal mode laser and at least one high-Q microresonator made on the same chip using microlithography.
Figure 12B:
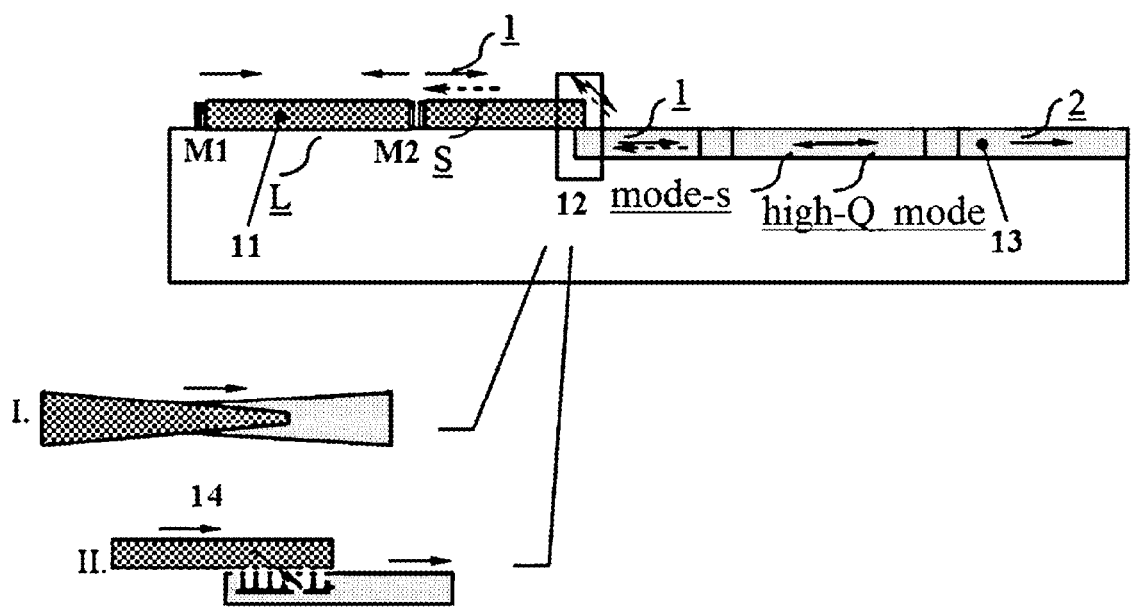
FIG. 12B schematically demonstrates the side view of the laser device of FIG. 12A.

In one of the embodiments, at least one high-Q microresonator may be fabricated on a semiconductor chip (silicon nitride or silicon-on-insulator) together with at least one multiple longitudinal mode laser. There is an example when such hybrid integration of the III-V gain materials for near infrared range with silicon photonic resonators was successful. So, in one of the embodiment, the at least one multiple longitudinal mode laser and the at least one high-Q microresonator may be made on the same chip using microlithography. FIGS. 12A and 12B schematically demonstrate the chip including one multiple longitudinal mode laser L having mirrors M1, M2 and one high-Q microresonator M, for example, one WGMs microresonator. On the top view shown in FIG. 12A, the multiple longitudinal mode laser L integrated in III-V gain material 11, for example, indium phosphide (InP), is coupled to a silicon/silicon nitride (Silicon/$Si_3N_4$) 13 waveguide via a special coupler 12. The coupler 12 interconnects a III-V material 11 layer with a bonded silicon/silicon nitride 13 layer (see side view in FIG. 12B) that contains a bus waveguide and the high-Q microresonator M. The coupler 12 may be fabricated either as a vertical connection of tapered waveguides (see variant I in FIG. 12B in which an enlarged view of a taper 14 is shown) or as a Bragg-grating vertical connection (see variant II in FIG. 12B in which an enlarged view of a grating 15 is shown) of the waveguides made from different materials. In the rest, the multiple longitudinal mode laser L and the high-Q microresonator M made on the chip may work in the same way as the laser device in FIG. 1A including tuner TU operation (not shown on the FIGS. 12A and 12B). In some embodiments, at least one multiple longitudinal mode laser may be optically feedback coupled to one or several of the at least one high-Q microresonator through the coupling element C configured as a waveguide located at subwavelength distance from the at least one high-Q microresonators. An additional coupling element C2 shown with the dashed border on FIG. 12A may be optionally used and be configured to couple out one or several of the dominant longitudinal laser modes generated in the one or several of the at least one high-Q microresonator to filter out a non-resonant part of the output spectrum. For high-Q microresonators and multiple longitudinal mode lasers fabricated on one semiconductor chip some individual elements of sub-units TL and TM associated with the lasers and microresonators may be correspondingly integrated on the same chip. Such elements might be metallic micro-heaters for microresonators' or lasers' active media temperature tuning, photodetectors for measuring output signals, etc.

The method of transforming a laser spectrum will be described with regard to at least one the multiple longitudinal mode laser L for generating a laser light having a spectrum of multiple longitudinal modes, at least one the high-Q microresonator M optically feedback coupled to the at least one multiple longitudinal mode laser L in FIGS. 1 to 5.

In the first operation of the method, a laser light having a spectrum of multiple longitudinal modes may be generated by at least one multiple longitudinal mode laser L.

In the second operation of the method, the spectrum of multiple longitudinal modes of the laser light may be tuned to match each of at least one frequency of an individual longitudinal mode of the at least one multiple longitudinal mode laser L with a respective resonance frequency of at least one high-Q microresonator M optically feedback coupled to the at least one multiple longitudinal mode laser L so as to obtain at least one matched frequency.

In the third operation of the method, an output laser light having a output spectrum with at least one dominant longitudinal laser mode each at one of the at least one matched frequency and at a reduced linewidth of the dominant longitudinal laser mode may be coupled out.

It should be noted that the method may include further operation.

For example, in case when the at least one high-Q microresonator M is made of a material having an intensity-dependent refraction index, the method may include a further operation of parametrically generating at least one optical frequency comb by each of the at least one dominant longitudinal laser mode, if the at least one dominant longitudinal laser mode has a power above a pump threshold of an optical frequency comb generation.

The method may include a further operation of tuning the spectrum of multiple longitudinal modes by both changing a spacing of the longitudinal modes at a frequency domain and changing a frequency of each of the individual longitudinal modes of the at least one multiple longitudinal mode laser L.

The method may include a further operation of providing an optical feedback to the at least one multiple longitudinal mode laser L by generating at least one counter-propagating mode each at one of the at least one matched frequency.

The method may include a further operation of tuning the spectrum of multiple longitudinal modes by controlling an injection current of the at least one multiple longitudinal mode laser and/or a temperature of a laser active medium of each of the at least one multiple longitudinal mode laser L, for example, each of the at least one multiple longitudinal mode laser individually.

The method may include a further operation of tuning resonance frequencies of each of the at least one high-Q microresonator M by both changing a spacing of the high-Q modes at a frequency domain and changing a resonance frequency of each of the high-Q modes.

The method may include a further operation of controlling a temperature of the at least one high-Q microresonator or/and an external pressure applied to the at least one high-Q microresonator M, for example, each of the at least one high-Q microresonator individually.

In case when one or several of the at least one high-Q microresonator M is/are provided with an additional coupling element C2, the method may include a further operation of coupling out one or several dominant longitudinal laser modes or the one or several dominant longitudinal laser modes and one or several optical frequency combs from one or several of the at least one high-Q microresonator through the additional coupling element to filter out a non-resonant part of the output spectrum.

In case when the at least one high-Q microresonator M is made of an electro-optical material changing its refractive index in response of an electromagnetic field applied the at least one high-Q microresonator, the method may include a further operation of controlling an electromagnetic field applied to each of the at least one high-Q microresonator M, for example, each of the at least one high-Q microresonator individually.

The method of operating the laser device will be described with regard to at least one the multiple longitudinal mode laser L for generating a laser light having a spectrum of multiple longitudinal modes, at least one the high-Q microresonator M optically feedback coupled to the at least one multiple longitudinal mode laser L, and the tuner TU for turning a spectrum of multiple longitudinal modes of the laser light as shown in FIGS. 1 to 6.

In the first operation of the method, the spectrum of multiple longitudinal modes of the laser light is tuned by the tuner TU to match each of at least one frequency of an individual longitudinal mode of the at least one multiple longitudinal mode laser with a respective resonance frequency of the at least one high-Q microresonator M so as to obtain at least one matched frequency.

In the second operation of the method, an output laser light having a output spectrum with at least one dominant longitudinal laser mode each at one of the at least one matched frequency and at a reduced linewidth of the dominant longitudinal laser mode is coupled out from the device.

The laser device and the method of transforming a laser spectrum, according to the embodiments, may provide a laser frequency stabilization and significant narrowing a laser spectrum due to its power-efficient transformation from a spectrum containing a plurality of relatively broad longitudinal modes into a narrow single-mode one or into a spectrum with several narrow spectral modes.

The described effect may occur by means of two mechanisms. The first one is a resonant optical feedback from a high quality factor (high-Q) optical microresonator as a result of injection of a laser light scattered in the high-Q microresonator back to the laser. And the second one is a laser longitudinal mode competition in condition of the optical feedback leading to efficient redistribution of a laser power in favor of one or several narrow laser lines.

In case of the microresonator made of a material having an intensity-dependent refraction index, generation of spectrally narrow laser lines at a power level above a pump threshold may provide parametrically generated one or several optical frequency combs having a plurality of narrow spectral modes spaced by fixed values of a frequency.

Moreover, there may be provided compact high-coherent powerful light sources, optical frequency comb sources or compact multiple wavelength lasers providing simultaneous stable generation at several wavelengths (frequencies) that is very important for many practical applications. There may be provided a laser device that may be applied in metrology using heterodyne effect, compact spectroscopic sensors including wearable devices, coherent LIDARs, optical data transfer etc.

It has to be noted that embodiments are described with reference to different subject matters. However, a person skilled in the art will gather from the above and the following description that, unless otherwise notified, in addition to any combination of features belonging to one type of subject matter, also any combination between features relating to different subject matters is considered to be disclosed with this application. However, all features may be combined providing synergetic effects that are more than the simple summation of the features.

While the embodiments have been illustrated and described in detail in the drawings and foregoing description, such illustration and description are to be considered illustrative or exemplary and not restrictive. The scope of claims is not limited to the disclosed embodiments. Other variations to the disclosed embodiments may be understood and effected by those skilled in the art in practicing a claimed invention, from a study of the drawings, the disclosure, and the dependent claims.

In the claims, the word "comprising" does not exclude other elements or components, and the indefinite article "a" or "an" does not exclude a plurality. The mere fact that certain measures are re-cited in mutually different dependent claims does not indicate that a combination of these measures cannot be used to advantage. Any reference signs in the claims should not be construed as limiting the scope.

What is claimed is:

1. A laser device comprising:
   at least one multiple longitudinal mode laser for generating a laser light having a spectrum of multiple longitudinal modes;
   a plurality of high quality factor (high-Q) microresonators optically feedback coupled in parallel to the at least one multiple longitudinal mode laser; and
   a tuner configured to tune the spectrum of multiple longitudinal modes of the laser light to match each of at least one frequency of an individual longitudinal mode of the at least one multiple longitudinal mode laser with a respective resonance frequency of the plurality of high-Q microresonators so as to obtain a plurality of matched frequencies,
   wherein the laser device is configured to output an output laser light having an output spectrum with at least one dominant longitudinal laser mode and at a reduced linewidth of the dominant longitudinal laser mode, and wherein each of the at least one dominant longitudinal laser mode corresponds to one of the plurality of matched frequencies, and
   wherein the plurality of high quality factor (high-Q) microresonators comprises:
      a first high-Q microresonator configured to generate one counter-propagating mode; and
      a second high-Q microresonator configured to generate two or more counter-propagating modes.

2. The laser device according to claim 1,
   wherein the plurality of high-Q microresonators comprises a material having an intensity-dependent refraction index,
   wherein the laser device is further configured to produce at least one optical frequency comb, and
   wherein each of the at least one optical frequency comb is parametrically generated by one of the at least one dominant longitudinal laser mode, based on the at least one dominant longitudinal laser mode having a power above a pump threshold of an optical frequency comb generation.

3. The laser device according to claim 1, wherein the tuner is configured to both change a spacing of the longitudinal modes at a frequency domain and change a frequency of each of the individual longitudinal modes of the at least one multiple longitudinal mode laser.

4. The laser device according to claim 1, wherein the plurality of high-Q microresonators is configured to provide an optical feedback to the at least one multiple longitudinal mode laser by generating at least one counter-propagating mode each at one of the plurality of matched frequencies.

5. The laser device according to claim 1, wherein the at least one multiple longitudinal mode laser includes an electrically powered semiconductor laser diode.

6. The laser device according to claim 1, wherein the at least one multiple longitudinal mode laser and the plurality of high-Q microresonators are made on a same chip using microlithography.

7. The laser device according to claim 1, wherein the tuner is further configured to control an injection current of the at least one multiple longitudinal mode laser or a temperature of a laser active medium of the at least one multiple longitudinal mode laser, or each of the at least one multiple longitudinal mode laser individually.

8. The laser device according to claim 1, wherein the at least one multiple longitudinal mode laser is optically feedback coupled to the plurality of high-Q microresonators by coupling out a light scattered in the plurality of high-Q microresonators back to the at least one multiple longitudinal mode laser.

9. The laser device according to claim 1, wherein at least one of the at least one multiple longitudinal mode laser is optically feedback coupled to one or several of the plurality of high-Q microresonators through a coupling element.

10. The laser device according to claim 9, wherein the coupling element comprises at least one of a total internal reflection prism, a tapered optical fiber, and a waveguide.

11. The laser device according to claim 9, wherein at least one of the plurality of high-Q microresonators is provided with an additional coupling element.

12. The laser device according to claim 11, wherein the additional coupling element is configured to:
    output at least one of the dominant longitudinal laser modes generated in the at least one of the plurality of high-Q microresonators or
    output the at least one of the dominant longitudinal laser modes and at least one of optical frequency combs generated in the at least one of the plurality of high-Q microresonators to filter out a non-resonant part of the output spectrum.

13. The laser device according to claim 2, wherein the at least one optical frequency comb is a dissipative Kerr soliton optical comb.

14. The laser device according to claim 1, wherein the tuner is further configured to tune resonance frequencies of the high-Q modes of the plurality of high-Q microresonators by both changing a spacing of high-Q modes at a frequency domain and changing a resonance frequency of each of the high-Q modes.

15. The laser device according to claim 1, wherein the tuner is configured to control a temperature of the plurality of high-Q microresonators or/and an external pressure applied to the plurality of high-Q microresonators, or each of the plurality of high-Q microresonators individually.

16. The laser device according to claim 1,
    wherein the plurality of high-Q microresonators comprises an electro-optical material changing its refractive index in response to an electromagnetic field applied the plurality of high-Q microresonators, and
    wherein the tuner is further configured to control the electromagnetic field applied to the plurality of high-Q microresonators, or each of the plurality of high-Q microresonators individually.

17. The laser device according to claim 1, wherein the plurality of high-Q microresonators is a whispering-gallery modes (WGMs) microresonator.

18. A method of transforming a laser spectrum, the method comprising:
    generating, by at least one multiple longitudinal mode laser, a laser light having a spectrum of multiple longitudinal modes;
    tuning the spectrum of multiple longitudinal modes of the laser light to match each of at least one frequency of an individual longitudinal mode of the at least one multiple longitudinal mode laser with a respective resonance frequency of a plurality of high-Q microresonators optically feedback coupled in parallel to the at least one multiple longitudinal mode laser so as to obtain a plurality of matched frequencies; and
    outputting an output laser light having an output spectrum with at least one dominant longitudinal laser mode and at a reduced linewidth of the dominant longitudinal laser mode, wherein each of the at least one dominant longitudinal laser mode corresponds to one of the plurality of matched frequencies,
    wherein the method further comprises:
        generating one counter-propagating mode by a first high-Q microresonator among the plurality of high quality factor (high-Q) microresonators, and
        generating two or more counter-propagating modes by a second high-Q microresonator among the plurality of high quality factor (high-Q) microresonators.

19. The method according to claim 18,
    wherein the plurality of high-Q microresonators comprises a material having an intensity-dependent refraction index, and
    wherein the method further comprises parametrically generating at least one optical frequency comb by each of the at least one dominant longitudinal laser mode, based on the at least one dominant longitudinal laser mode having a power above a pump threshold of an optical frequency comb generation.

20. The method according to claim 18, wherein the spectrum of multiple longitudinal modes is tuned by both changing a spacing of the longitudinal modes at a frequency domain and changing a frequency of each of the individual longitudinal modes of the at least one multiple longitudinal mode laser.

21. The method according to claim 18, wherein the plurality of high-Q microresonators is configured to provide an optical feedback to the at least one multiple longitudinal mode laser by generating at least one counter-propagating mode each at one of the plurality of matched frequencies.

22. The method according to claim 18, wherein the spectrum of multiple longitudinal modes is tuned by controlling an injection current of the at least one multiple longitudinal mode laser or a temperature of a laser active medium of the at least one multiple longitudinal mode laser, or each of the at least one multiple longitudinal mode laser individually.

23. The method according to claim 21, wherein the at least one counter-propagating mode coupled back to the at least one multiple longitudinal mode laser is generated due to a resonant Rayleigh scattering in the plurality of high-Q microresonators.

24. The method according to claim 18, wherein at least one of the at least one multiple longitudinal mode laser is optically feedback coupled to one or several of the plurality of high-Q microresonators through a coupling element.

25. The method according to claim 24, wherein the coupling element is at least one of a total internal reflection prism, a tapered optical fiber, and a waveguide.

26. The method according to claim 24, wherein at least one of the plurality of high-Q microresonators is provided with an additional coupling element.

27. The method according to claim 26, wherein at least one of the dominant longitudinal laser modes or the at least one of the dominant longitudinal laser modes and at least one of optical frequency combs are output from at least one of the plurality of high-Q microresonators through the additional coupling element to filter out a non-resonant part of the output spectrum.

28. The method according to claim 18, wherein resonance frequencies of high-Q modes of the plurality of high-Q microresonators are tuned by both changing a spacing of high-Q modes at a frequency domain and changing a resonance frequency of each of the high-Q modes.

29. The method according to claim 18, wherein the method further comprises controlling a temperature of the plurality of high-Q microresonators or an external pressure applied to the plurality of high-Q microresonators, or each of the plurality of high-Q microresonators individually.

30. The method according to claim 18,
wherein the plurality of high-Q microresonators is made of an electro-optical material changing its refractive index in response to an electromagnetic field applied the plurality of high-Q microresonators, and
wherein the method further comprises controlling the electromagnetic field applied to the plurality of high-Q microresonators, or each of the plurality of high-Q microresonators individually.

31. The method according to claim 18, wherein the plurality of high-Q microresonators includes a whispering-gallery modes (WGMs) microresonator.

32. A method of operating a laser device that includes at least one multiple longitudinal mode laser for generating a laser light having a spectrum of multiple longitudinal modes and a plurality of high quality factor (high-Q) microresonator optically feedback coupled in parallel to the at least one multiple longitudinal mode laser, the method comprising:

tuning, by a tuner, the spectrum of multiple longitudinal modes of the laser light to match each of at least one frequency of an individual longitudinal mode of the at least one multiple longitudinal mode laser with a respective resonance frequency of the plurality of high-Q microresonators so as to obtain a plurality of matched frequencies; an outputting an output laser light having an output spectrum with at least one dominant longitudinal laser mode each at one of the plurality of matched frequencies and at a reduced linewidth of the dominant longitudinal laser mode, wherein the method further comprises:
generating one counter-propagating mode by a first high-Q microresonator among the plurality of high quality factor (high-Q) microresonators, and
generating two or more counter-propagating modes by a second high-Q microresonator among the plurality of high quality factor (high-Q) microresonators.

* * * * *